(12) United States Patent
Ching et al.

(10) Patent No.: US 10,886,269 B2
(45) Date of Patent: Jan. 5, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Kuo-Cheng Ching, Hsinchu County (TW); Kuan-Ting Pan, Taipei (TW); Shi-Ning Ju, Hsinchu (TW); Kuan-Lun Cheng, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/133,795

(22) Filed: Sep. 18, 2018

(65) Prior Publication Data
US 2020/0091142 A1 Mar. 19, 2020

(51) Int. Cl.
| | |
|---|---|
| *H01L 21/00* | (2006.01) |
| *H01L 27/088* | (2006.01) |
| *H01L 29/06* | (2006.01) |
| *H01L 29/78* | (2006.01) |
| *H01L 29/66* | (2006.01) |
| *H01L 21/8234* | (2006.01) |
| *H01L 21/762* | (2006.01) |
| *H01L 21/308* | (2006.01) |

(52) U.S. Cl.
CPC ...... *H01L 27/0886* (2013.01); *H01L 21/3086* (2013.01); *H01L 21/76224* (2013.01); *H01L 21/823431* (2013.01); *H01L 21/823481* (2013.01); *H01L 29/0649* (2013.01); *H01L 29/6681* (2013.01); *H01L 29/66545* (2013.01); *H01L 29/7851* (2013.01)

(58) Field of Classification Search
CPC .......... H01L 27/0886; H01L 29/0649; H01L 29/7851
See application file for complete search history.

(56) References Cited

U.S. PATENT DOCUMENTS

| | | |
|---|---|---|
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,418,897 B1 * | 8/2016 | Ching ............... H01L 27/10879 |
| 9,520,482 B1 | 12/2016 | Chang et al. |
| 9,576,814 B2 | 2/2017 | Wu et al. |
| 9,608,116 B2 | 3/2017 | Ching et al. |

(Continued)

*Primary Examiner* — Laura M Menz
(74) *Attorney, Agent, or Firm* — McClure, Qualey & Rodack, LLP

(57) ABSTRACT

A semiconductor device has a substrate, a first dielectric fin, and an isolation structure. The substrate has a first semiconductor fin. The first dielectric fin is disposed over the substrate and in contact with a first sidewall of the first semiconductor fin, in which a width of the first semiconductor fin is substantially equal to a width of the first dielectric fin. The isolation structure is in contact with the first semiconductor fin and the first dielectric fin, in which a top surface of the isolation structure is in a position lower than a top surface of the first semiconductor fin and a top surface of the first dielectric fin.

17 Claims, 34 Drawing Sheets

(56) References Cited

U.S. PATENT DOCUMENTS

| | | | |
|---|---|---|---|
| 9,812,363 B1 | 11/2017 | Liao et al. | |
| 9,859,380 B2 | 1/2018 | Lee et al. | |
| 10,014,296 B1* | 7/2018 | Dou | H01L 29/66545 |
| 10,510,873 B2* | 12/2019 | Ching | H01L 21/823821 |
| 2015/0008483 A1* | 1/2015 | Ching | H01L 21/02107 |
| | | | 257/190 |
| 2017/0141106 A1* | 5/2017 | Chang | H01L 21/0223 |
| 2019/0006486 A1* | 1/2019 | Ching | H01L 29/0653 |
| 2019/0035785 A1* | 1/2019 | Ching | H01L 29/7851 |
| 2019/0067445 A1* | 2/2019 | Ching | H01L 29/785 |
| 2019/0157090 A1* | 5/2019 | Jang | H01L 21/31116 |
| 2019/0305082 A1* | 10/2019 | Ching | H01L 21/823878 |
| 2020/0043935 A1* | 2/2020 | Liaw | H01L 29/6681 |
| 2020/0075423 A1* | 3/2020 | Kwok | H01L 21/823481 |
| 2020/0091142 A1* | 3/2020 | Ching | H01L 21/3086 |
| 2020/0091311 A1* | 3/2020 | Hsu | H01L 29/66545 |
| 2020/0105604 A1* | 4/2020 | Lin | H01L 21/31116 |
| 2020/0105616 A1* | 4/2020 | Liaw | H01L 21/823821 |
| 2020/0119159 A1* | 4/2020 | Ching | H01L 21/82387 |
| 2020/0279853 A1* | 9/2020 | Ohtou | H01L 21/823468 |
| 2020/0294804 A1* | 9/2020 | Jang | H01L 29/0653 |
| 2020/0321449 A1* | 10/2020 | Leib | H01L 23/53209 |

\* cited by examiner

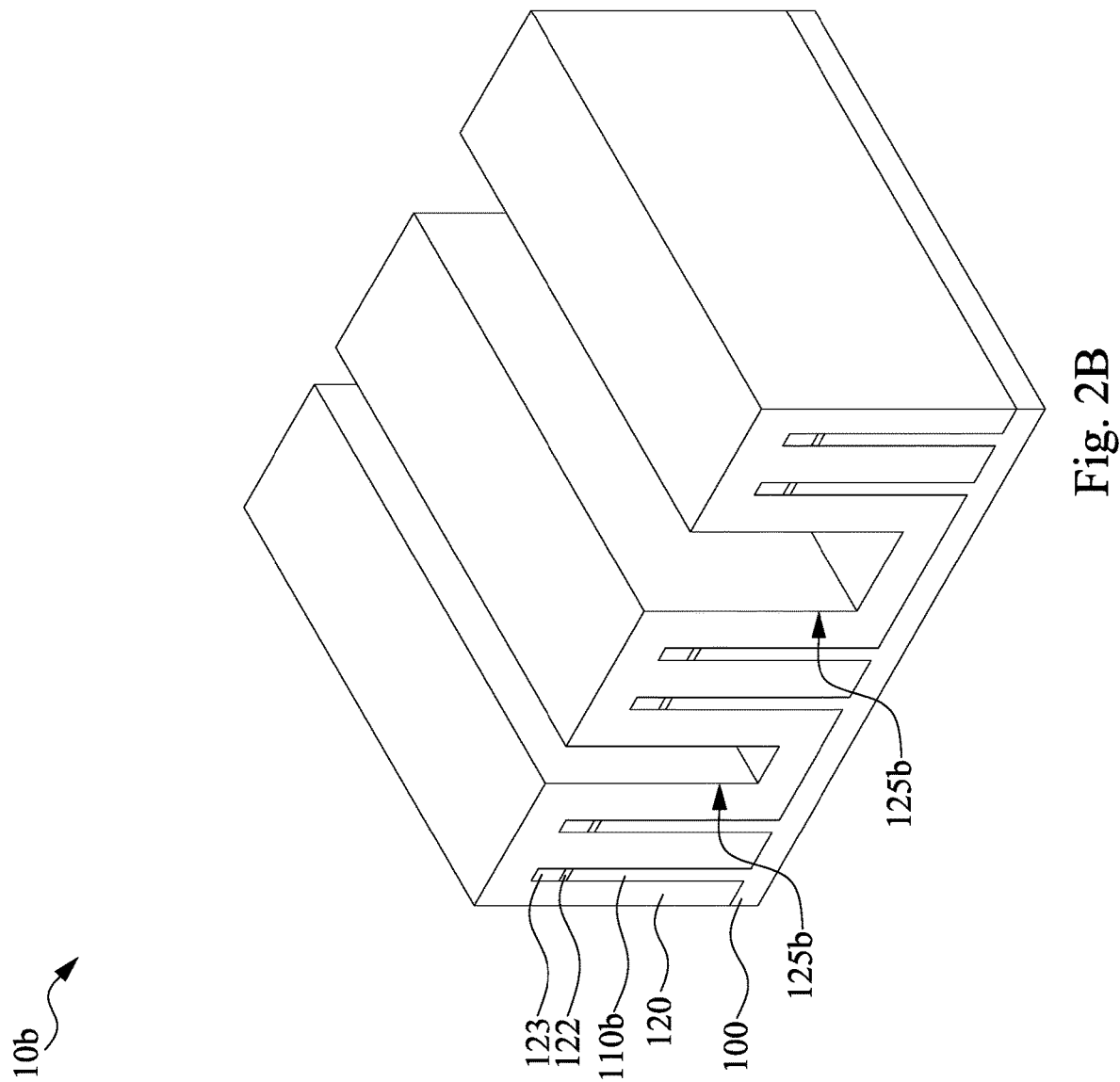

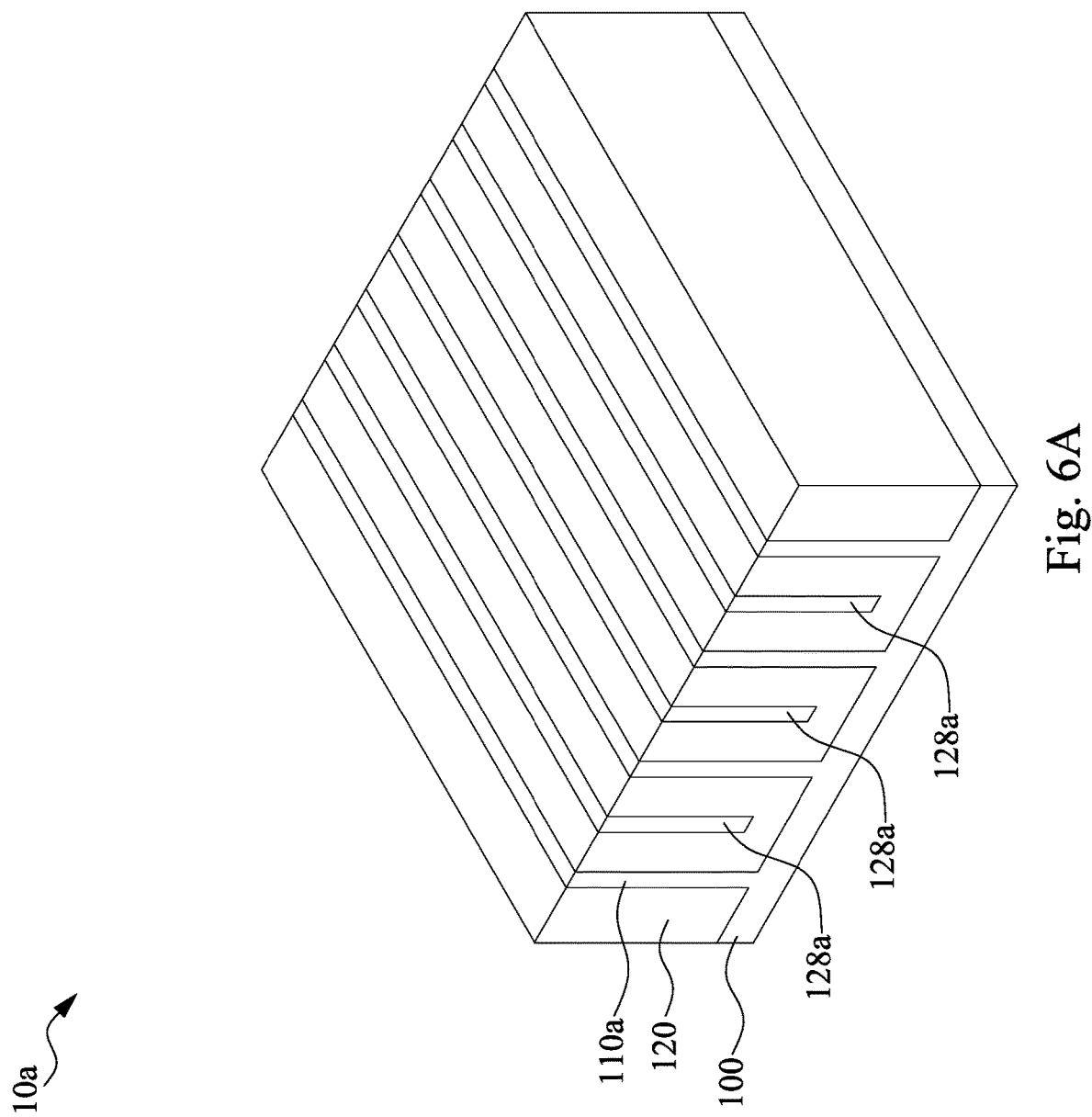

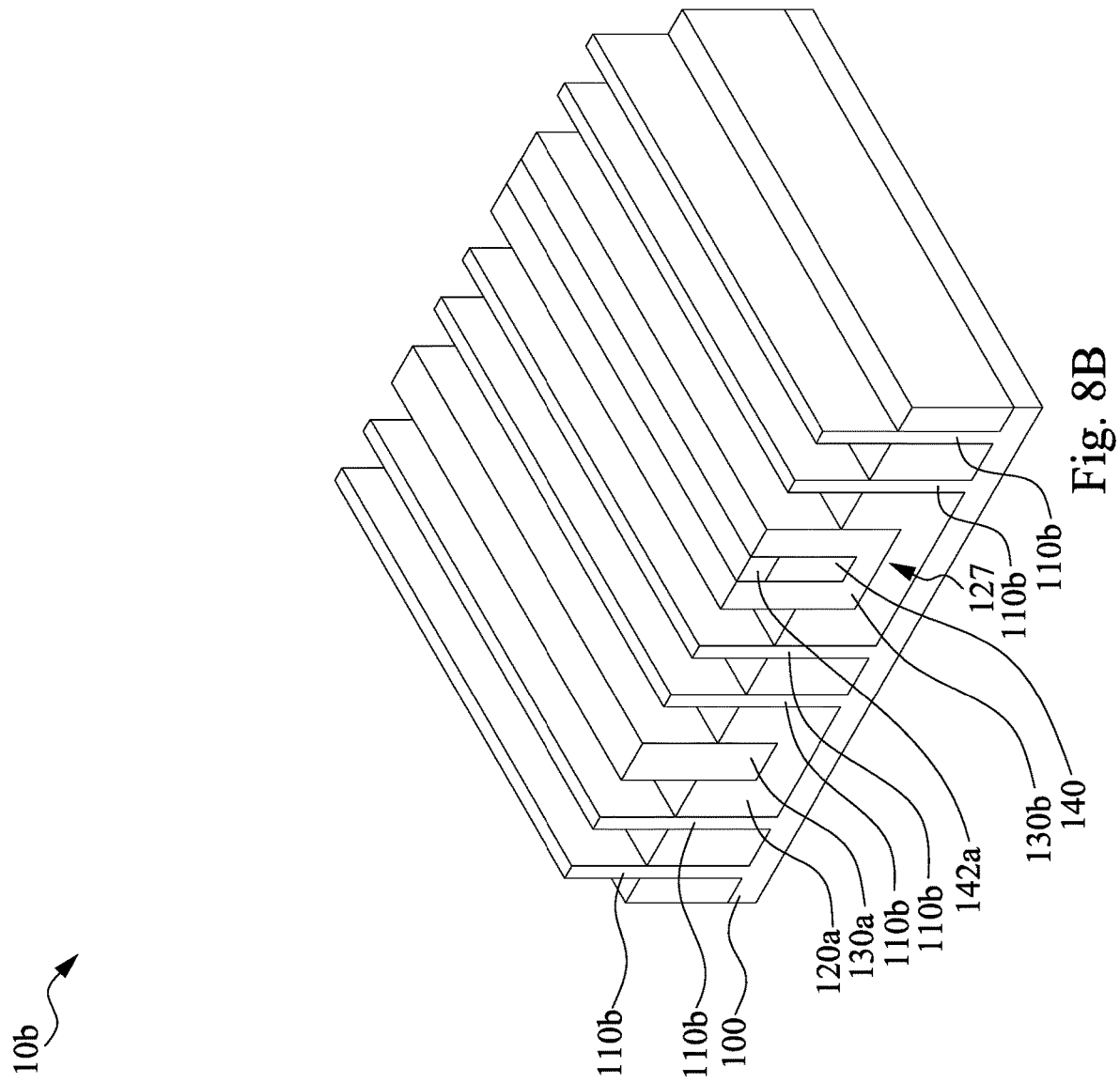

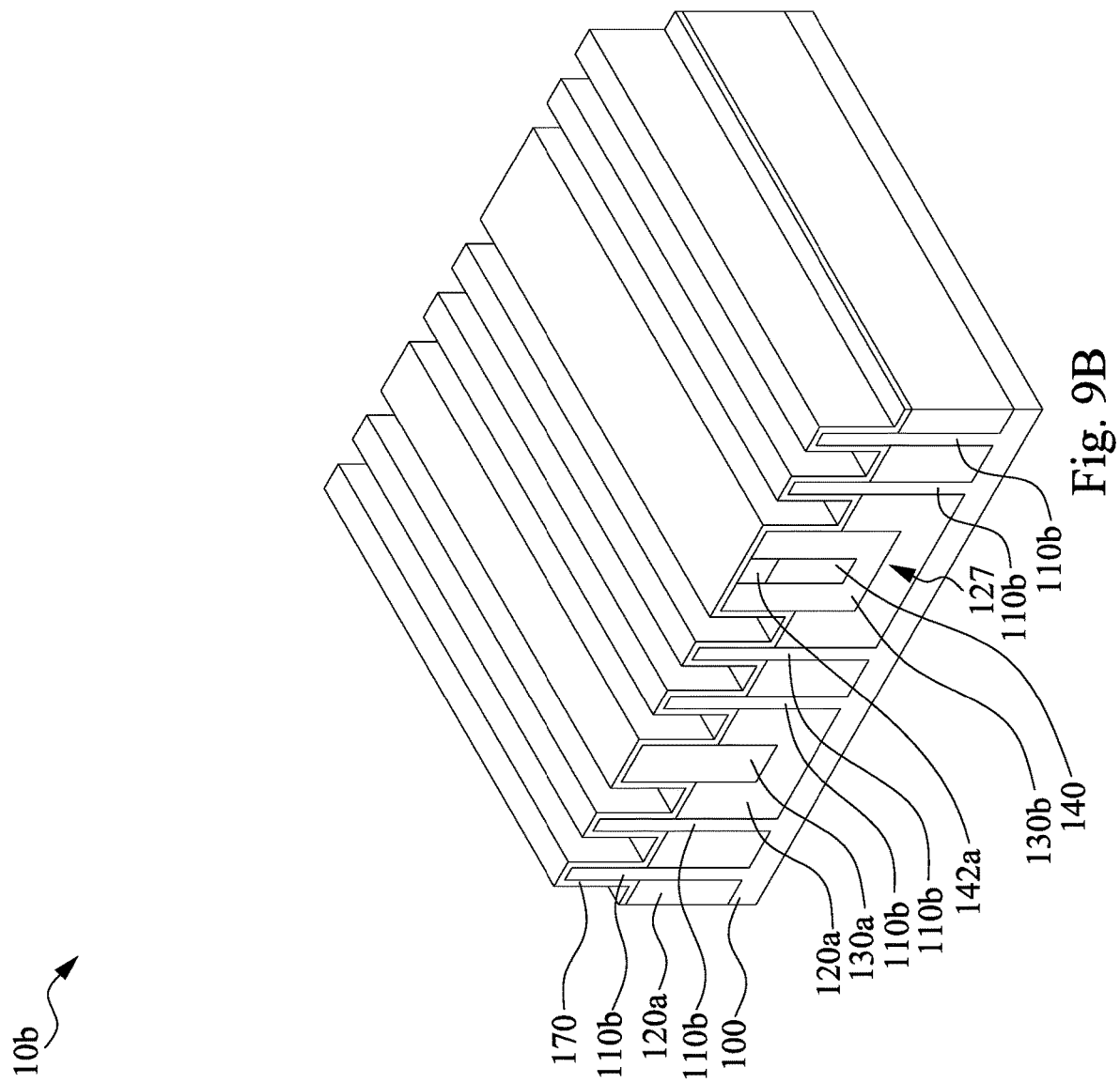

SEMICONDUCTOR DEVICE AND MANUFACTURING METHOD THEREOF

BACKGROUND

The semiconductor integrated circuit (IC) industry has experienced rapid growth. In the course of IC evolution, functional density (i.e., the number of interconnected devices per chip area) has increased while geometry size (i.e., the smallest component (or line) that can be created using a fabrication process) has decreased. This scaling down process increases production efficiency and lowers associated costs.

Such scaling down has also increased the complexity of processing and manufacturing ICs and, for these advances to be realized, similar developments in IC processing and manufacturing are desired. For example, a three dimensional transistor, such as a fin-like field-effect transistor (FinFET), has been introduced to replace a planar transistor.

Isolation structures such as dummy fins are used for isolating fins in semiconductor structures. However, when the dummy fins are formed, in some conditions, the quality of the dummy fins is poor, which results in deteriorating the dummy fins during wet or dry processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 14A are perspective views of a method for manufacturing a semiconductor device at various stages in accordance with some embodiments of the present disclosure.

FIGS. 1B to 14B are perspective views of a method for manufacturing a semiconductor device at various stages in accordance with some embodiments of the present disclosure.

DETAILED DESCRIPTION

Figure 1A:
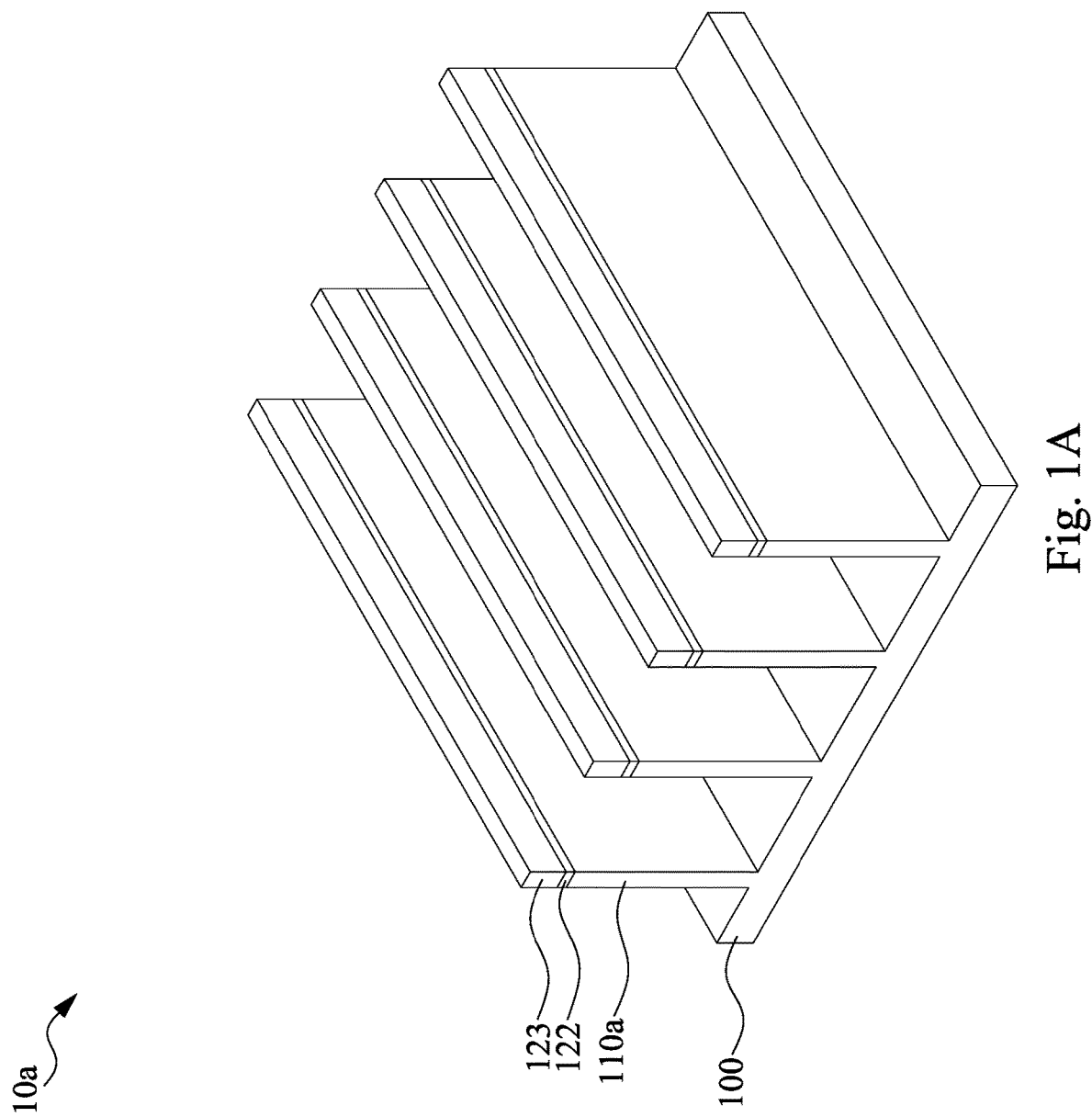

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1A to 14A are perspective views of a method for manufacturing a semiconductor device at various stages in accordance with some embodiments of the present disclosure. FIGS. 1B to 14B are perspective views of a method for manufacturing a semiconductor device at various stages in accordance with some embodiments of the present disclosure.

Figure 1B:
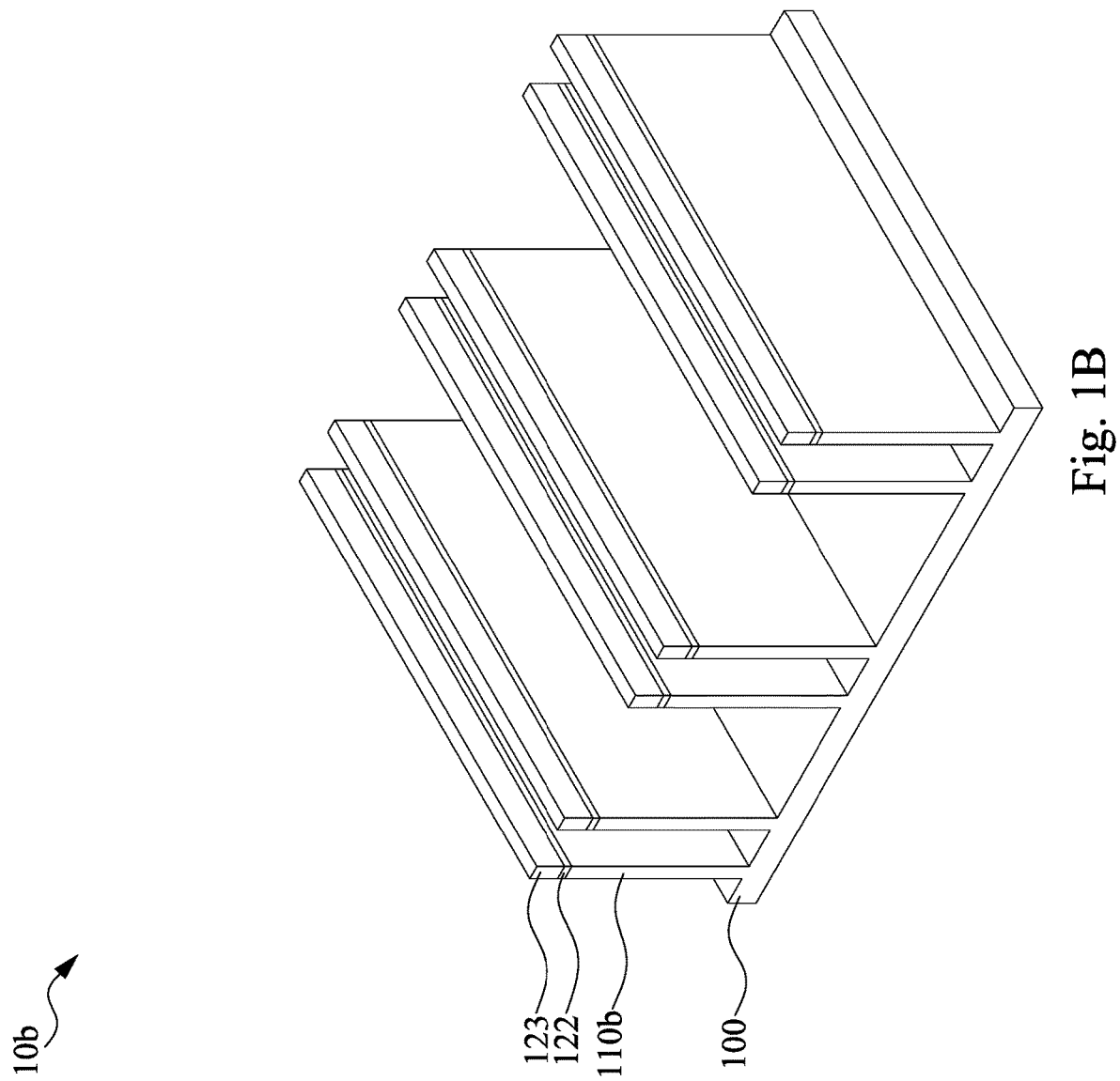

Reference is made to FIGS. 1A to 1B. The semiconductor device includes a memory region 10a, e.g., an SRAM circuit region, and a logic circuit region 10b. In the following description, the memory circuit region is referred to as the memory region 10a, and the logic circuit region is referred to as the logic region 10b.

A substrate 100 is provided. It is noted that, in some embodiments, the memory region 10a and the logic region 10b are concurrently formed on the same semiconductor device. That is, the substrates 100 respectively described in FIGS. 1A and 1B are different regions of the same substrate. However, in some other embodiments, the memory region 10a and the logic region 10b of the semiconductor device may also be formed on different substrates.

The substrate 100 may be a bulk silicon substrate. Alternatively, the substrate 100 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 100 also include a silicon-on-insulator (SOI) substrate. SOI substrates are fabricated using separation by implantation of oxygen (SIMOX), wafer bonding, and/or other suitable methods.

The doped regions may be doped with p-type dopants, such as boron or $BF_2$; n-type dopants, such as phosphorus or arsenic; or combinations thereof. The doped regions may be formed directly on the substrate 100, in a P-well structure, in an N-well structure, in a dual-well structure, and/or using a raised structure. The substrate 100 may further include various active regions, such as regions configured for an N-type metal-oxide-semiconductor transistor device and regions configured for a P-type metal-oxide-semiconductor transistor device.

Semiconductor fins 110a are formed over the substrate 100 within the memory region 10a, and semiconductor fins 110b are formed over the substrate 100 within the logic region 10b. In some embodiments, the semiconductor fins 110a may be the same type, and the fins 110b may be the same type, and the present disclosure is not limited in this respect.

In some embodiments, a pad layer 122 and a mask layer 123 are disposed on the semiconductor fins 110a and 110b. In some embodiments, the pad layer 122 may be a thin film comprising silicon oxide formed, for example, using a thermal oxidation process. The pad layer 122 may act as an adhesion layer between the semiconductor fins 110a, 110b and the mask layer 123. In some embodiments, the mask layer 123 is formed of silicon nitride, for example, using low-pressure chemical vapor deposition (LPCVD) or plasma enhanced chemical vapor deposition (PECVD). The mask layer 123 is used as a hard mask during following processes, such as photolithography.

The semiconductor fins 110a and 110b may be formed by suitable method. For example, a pad layer and a mask layer may be blanketed over the substrate 100. A patterned photo-sensitive layer is formed over the substrate 100. Then, the pad layer, the mask layer, and the substrate 100 may be patterned using one or more photolithography processes with the patterned photo-sensitive layer, including double-patterning or multi-patterning processes, to form the pad layer 122, the mask layer 123, and the semiconductor fins 110a and 110b.

Figure 2A:
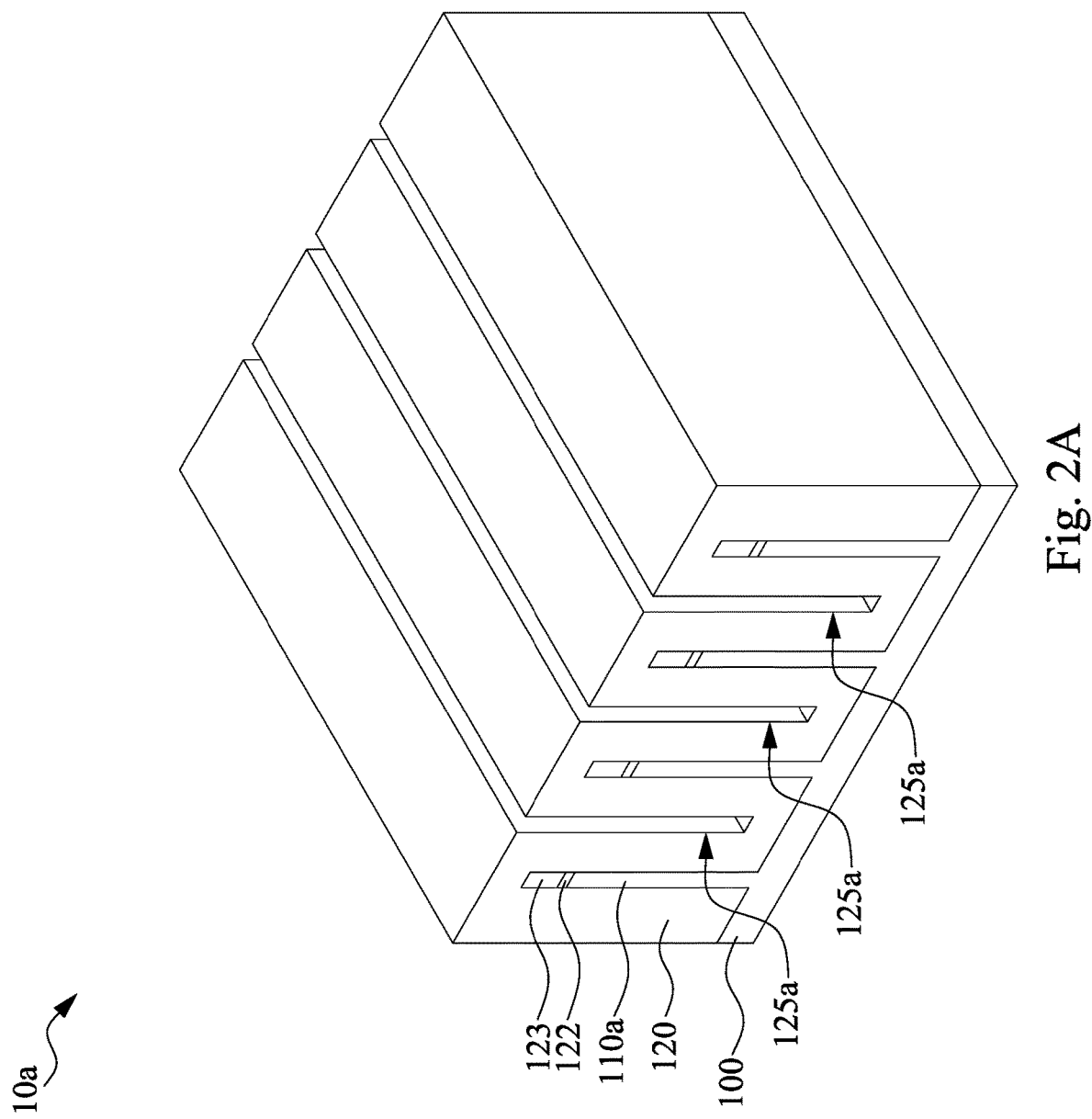

Reference is made to FIGS. 2A to 2B. An isolation layer 120 is formed over the substrate 100. In some embodiments, the isolation layer 120 is formed to conformally cover the semiconductor fins 110a and 110b by suitable deposition process, such as atomic layer deposition (ALD). Thus, plural trenches 125a and 125b are formed in the isolation layer 120 and between the semiconductor fins 110a or between the semiconductor fins 110b. For example, some trenches 125a are formed between the fins 110a, and some other trenches 125b are formed between the fins 110b.

In some embodiments, the trenches 125a and 125b are formed with different widths. For example, the trenches 125b may have a width greater than a width of the trenches 125a. One of the trenches 125b may have a width greater than a width of the other of the trenches 125b.

However, in some embodiments, if two adjacent fins are too close, the isolation layer 120 may be filled in the space between the fins. For example, in FIG. 3B, since the semiconductor fins 110b are close enough, the isolation layer 120 is filled in the space between the adjacent semiconductor fins 110b. That is, no trench is formed between the semiconductor fins 110b. Similar structures also presents in some of the semiconductor fins within the memory region 10a, and are not repeated herein for simplicity.

Figure 3A:
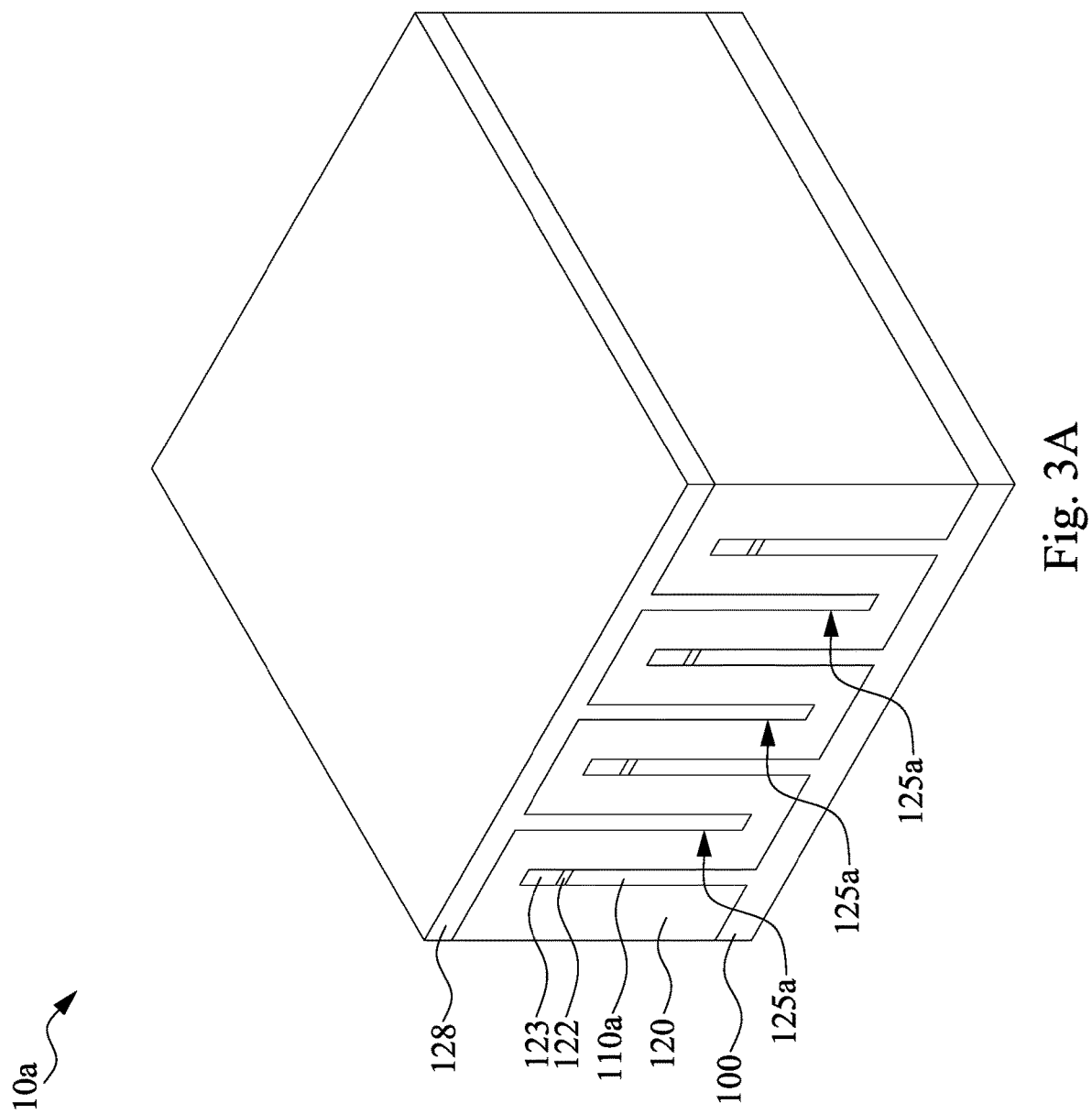
Figure 3B:
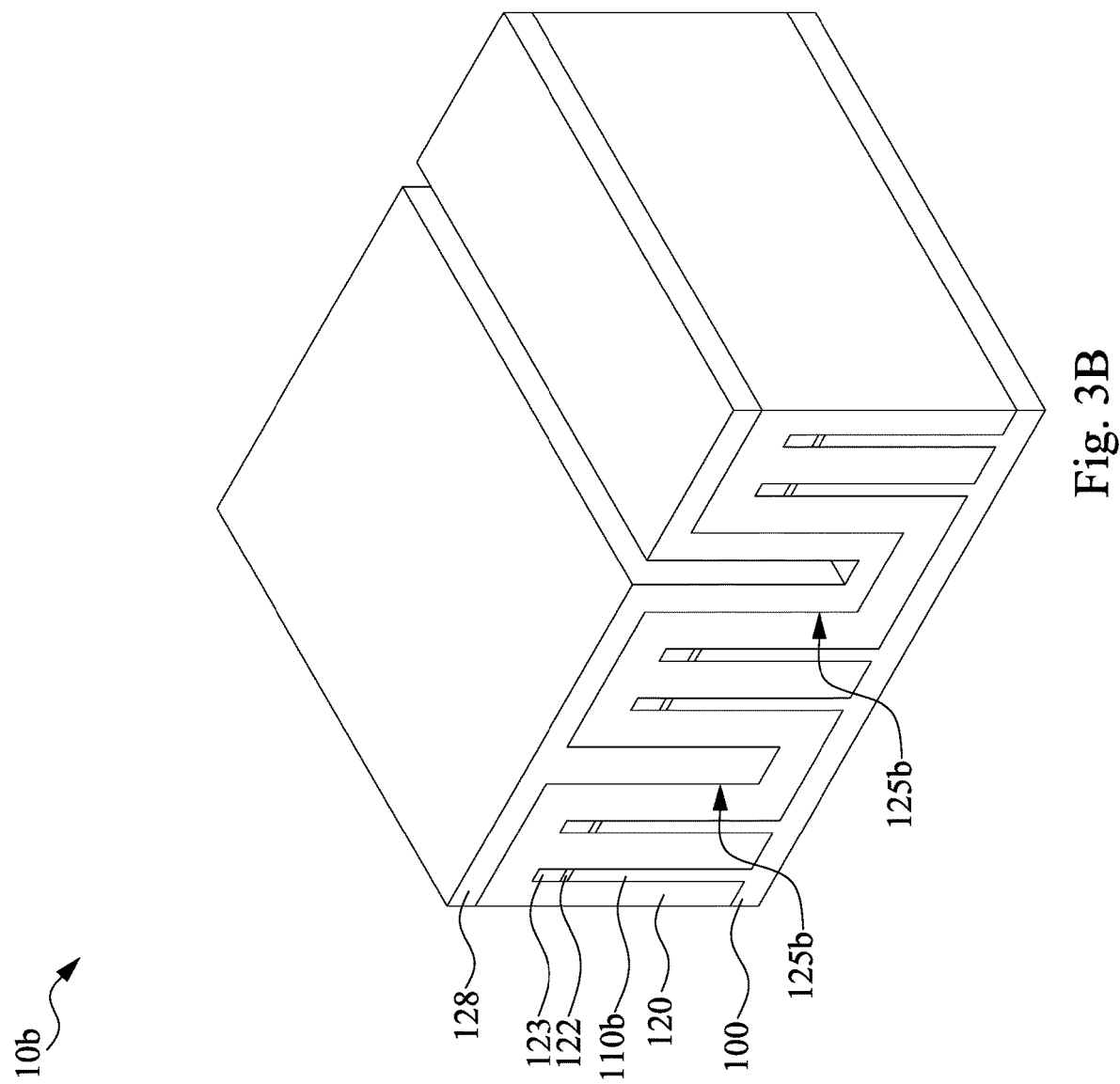

Reference is made to FIGS. 3A to 3B. A dielectric fin layer 128 is formed over the substrate 100 and covers the isolation layer 120. The dielectric fin layer 128 is filled in the trenches 125a and 125b in the isolation layer 120. In some embodiments, the dielectric fin layer 128 may include metal oxides, such as $HfO_2$, $ZrO_2$, $HfAlO_x$, $HfSiO_x$ and the like and may be formed by methods utilized to form such a layer, such as CVD, plasma enhanced CVD, sputter, and other methods known in the art. In some embodiments, the dielectric fin layer 128 may be made from other high-k materials other than metal dielectric materials.

Figure 4A:
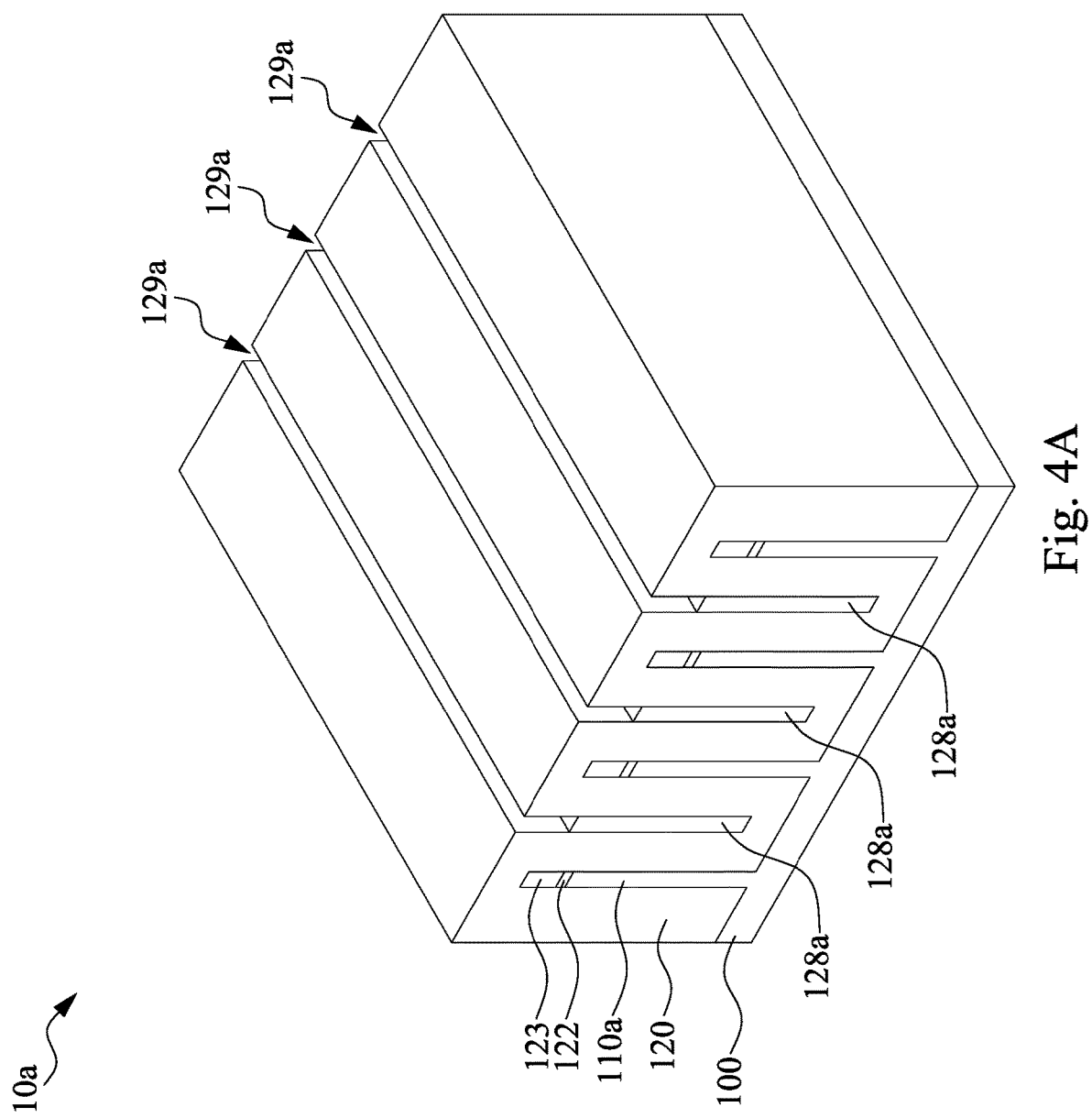
Figure 4B:
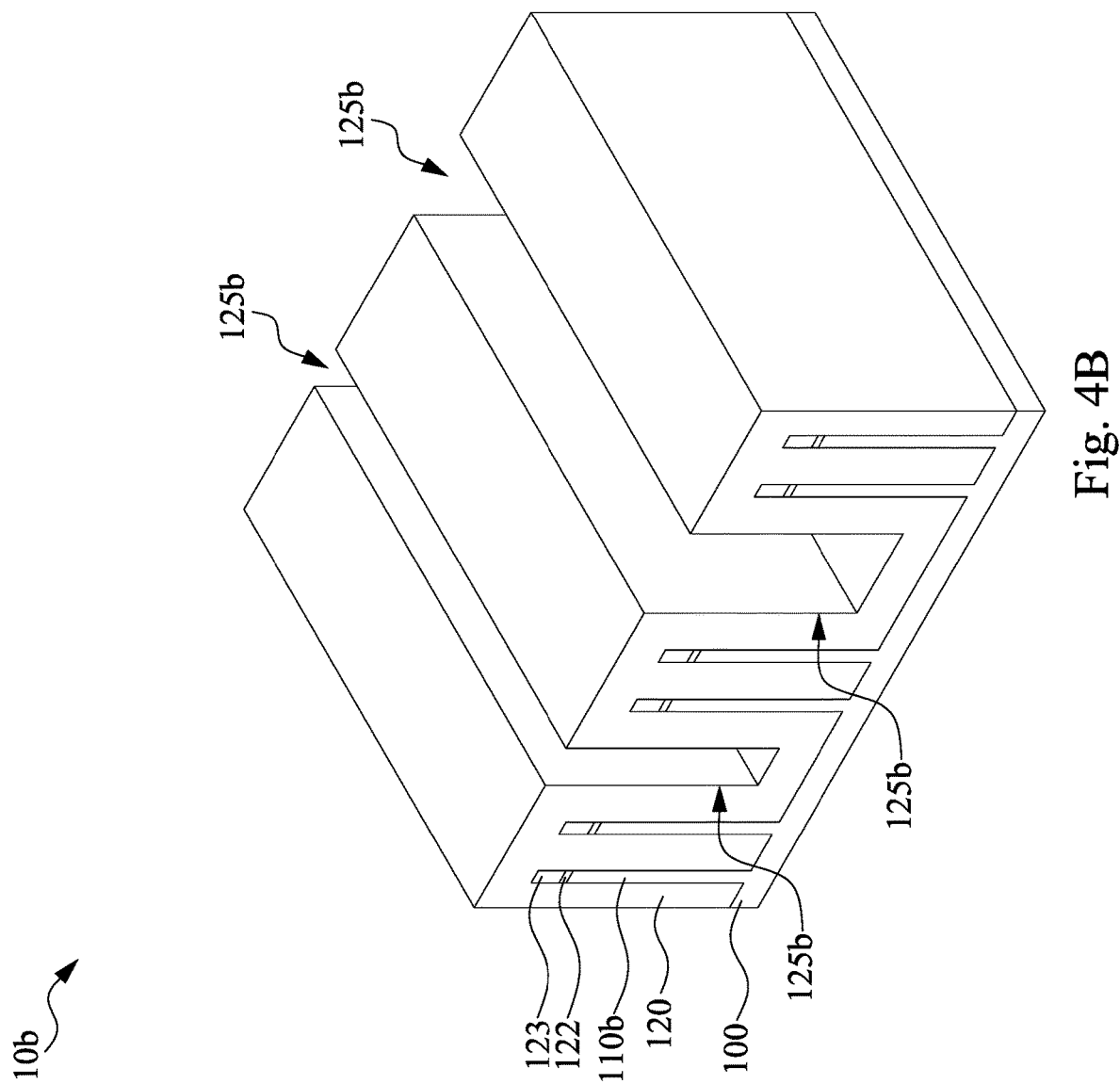

Reference is made to FIGS. 4A to 4B. One or more etching process(es) are performed to remove excess dielectric fin layer 128 in the memory region 10a and remove all dielectric fin layer 128 in the logic region 10b. Therefore, the remained dielectric fin layers 128a are formed as the dielectric fins 128a that are between adjacent semiconductor fins 110a. The dielectric fins 128a may be referred as dummy fins 128a.

Figure 5A:
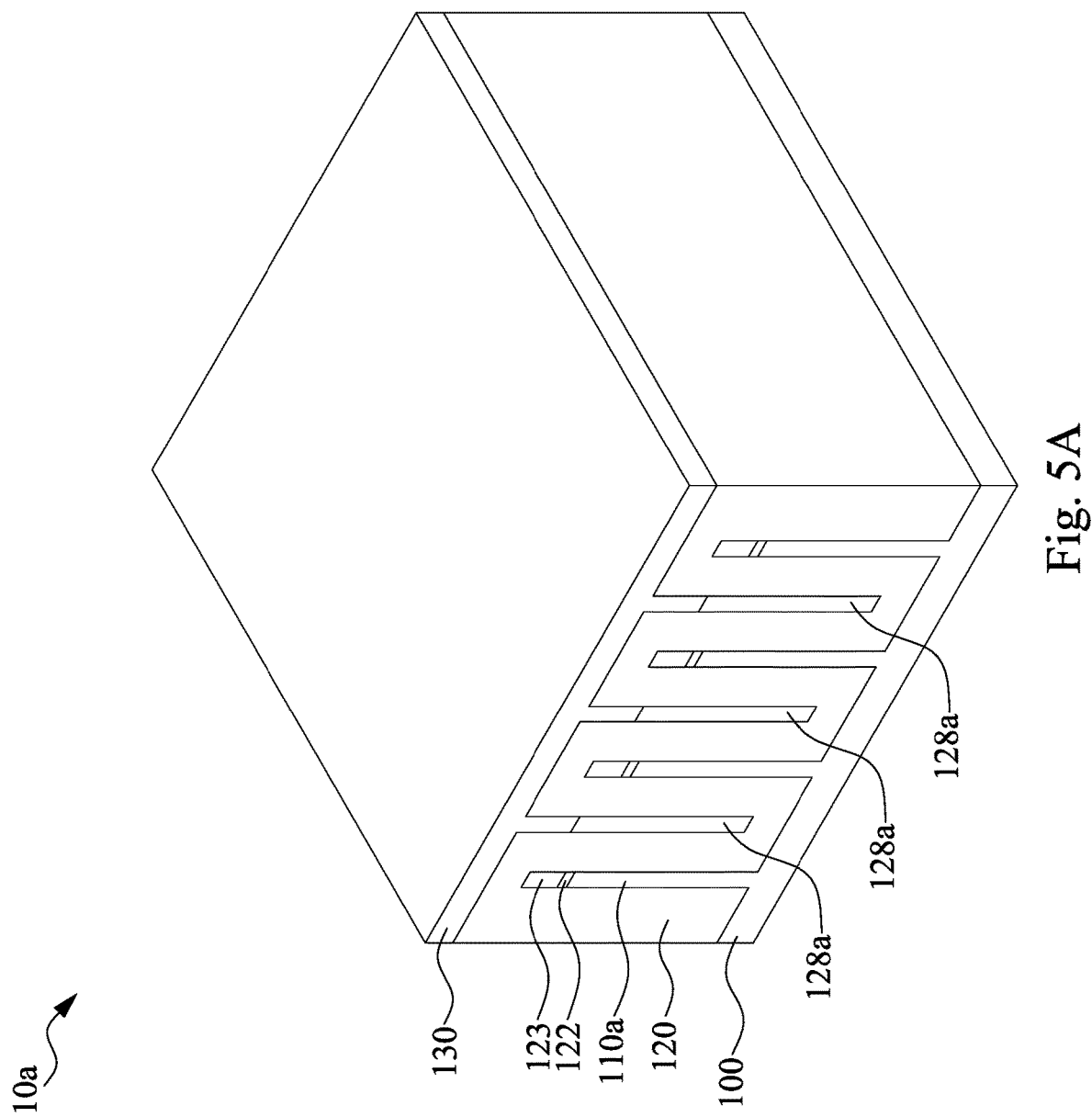
Figure 5B:
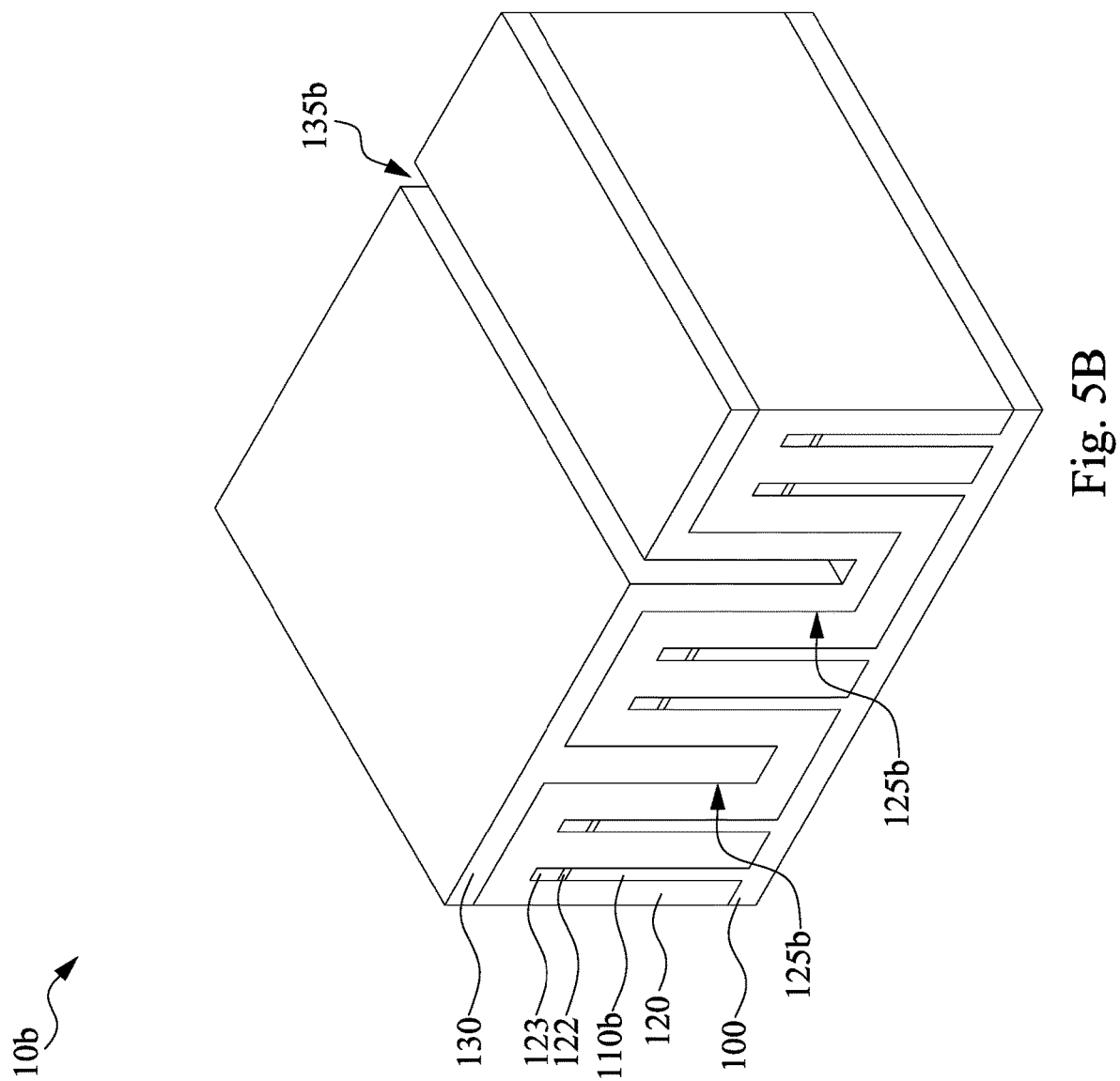

Reference is made to FIGS. 5A to 5B. A dielectric fin layer 130 is formed over the substrate 100 and covers the isolation layer 120. The dielectric fin layer 130 is filled in the trenches 129a and 125b in the isolation layer 120. In some embodiments, the dielectric fin layer 130 may include silicon nitride (SiN), oxynitride, silicion carbon (SiC), silicon oxynitride (SiON), oxide, $SiO_2$, $Si_3N_4$, SiOCN, and the like and may be formed by methods utilized to form such a layer, such as CVD, plasma enhanced CVD, sputter, and other methods known in the art. In some embodiments, the dielectric fin layer 130 may be made from low-k dielectric materials other than nitride dielectric materials.

Figure 5C:
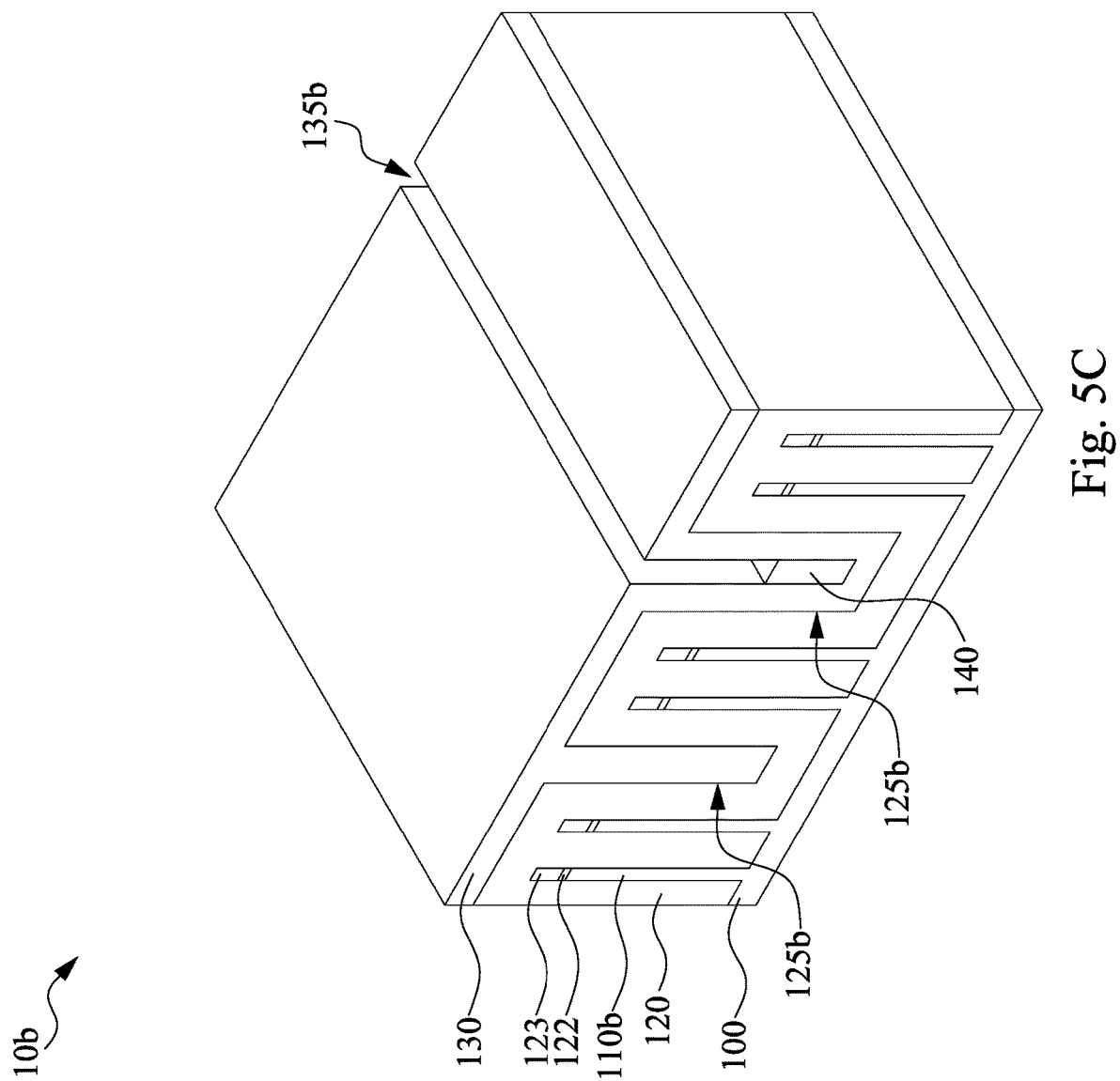
FIGS. 5C to 5D are perspective views of a method for manufacturing a semiconductor device at various stages in accordance with some embodiments of the present disclosure.

Reference is made to FIG. 5C. An oxide layer 140 is deposited in the trench 135b. In some embodiments, the oxide layer 140 may be deposited by first depositing a flowable oxide and converting the flowable oxide to silicon oxide. The flowable oxide may be deposited using a spin on glass (SOG) or flowable chemical vapor deposition (FCVD) process. Unlike the HDPCVD process, the SOG process and the FCVD process do not damage the semiconductor substrate 100 (the sidewall and bottom of the trench). Thus, the current leakage caused by the HDPCVD process can be avoided. After being deposited in the trench 135b, the flowable oxide may be cured at a temperature ranging from about 600 degrees C. to about 1000 degrees C., to convert the flowable oxide to silicon oxide. One or more etching process(es) are performed to remove at least part of the oxide layer 140 until a top of the oxide layer 140 is below a top of the semiconductor fins 110b. The oxide layer 140 may be referred as the dielectric fin layer 140. In some embodiments, a chemical mechanical planarization (CMP) process may be performed before the etching process(es) to remove the oxide layer 140 inside the trench 135b.

Figure 5D:
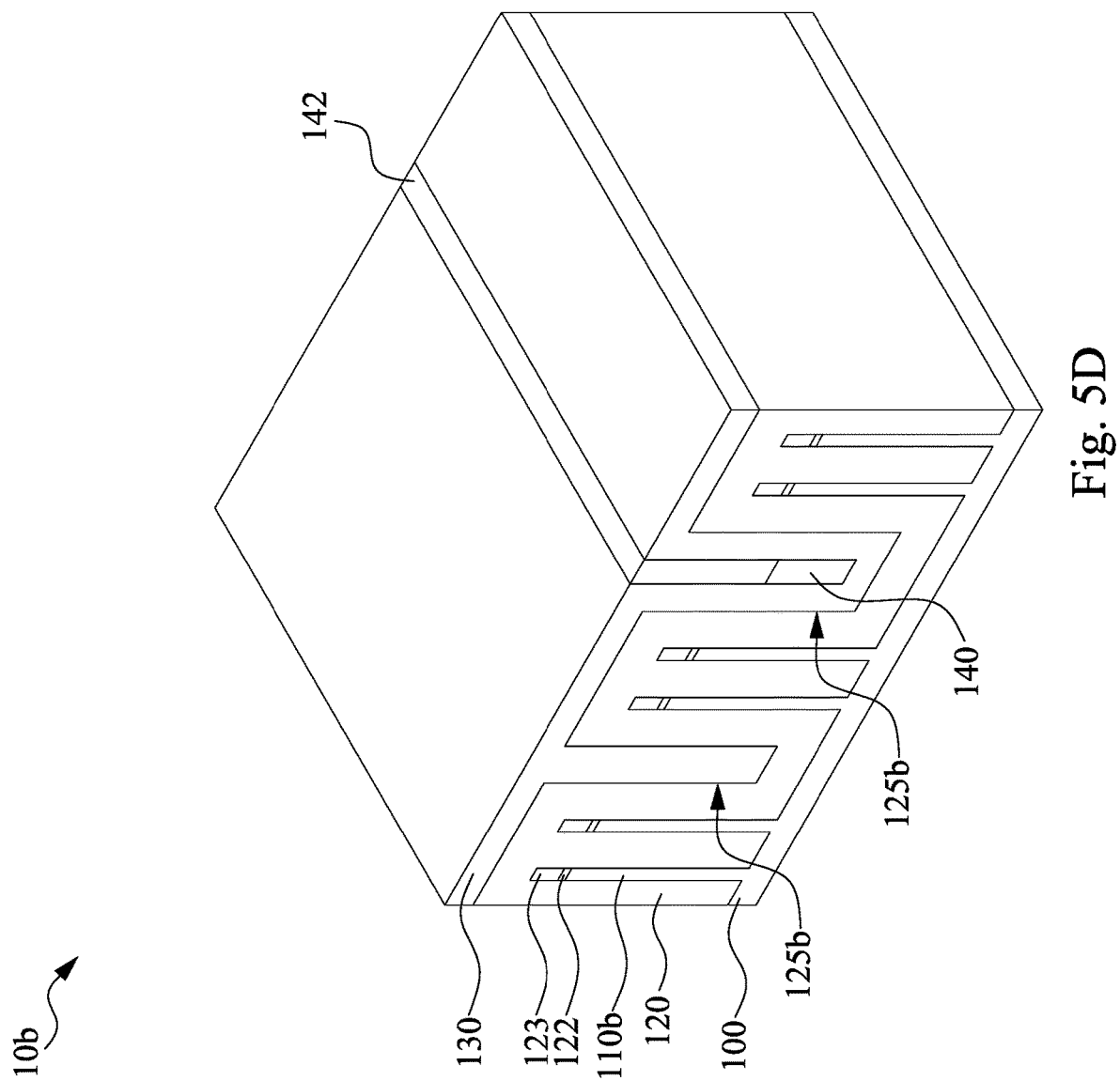

Reference is made to FIG. 5D. A dielectric fin layer 142 is deposited in the trench 135b and on a top of the oxide layer 140. In some embodiments, the dielectric fin layer 142 is deposited over the dielectric fin layer 130, e.g., over the memory region 10a and the logic region 10b, and filled in the trench 135b, and an etching is performed to remove excess dielectric fin layer 142. In some embodiments, the dielectric fin layer 142 may include metal oxides, such as $HfO_2$, $ZrO_2$, $HfAlO_x$, $HfSiO_x$ and the like and may be formed by methods utilized to form such a layer, such as CVD, plasma enhanced CVD, sputter, and other methods known in the art. In some embodiments, the dielectric fin layer 142 may be made from other high-k materials other than metal dielectric materials. In some embodiments, the dielectric fin layer 142 may be made from the same materials as the dielectric fin layer 128, e.g., the same metal oxides.

Figure 6B:
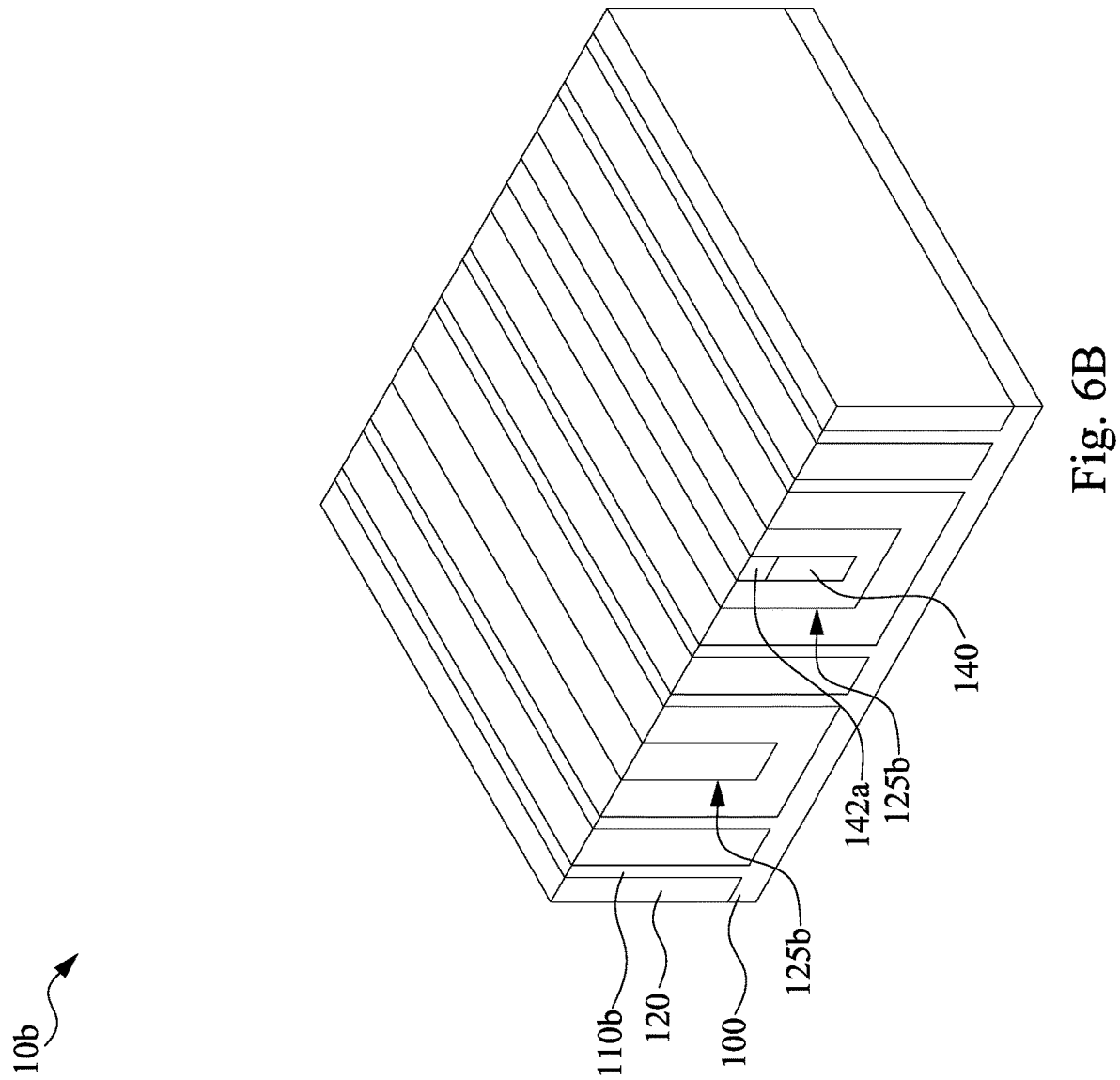

Reference is made to FIGS. 6A to 6B. A CMP process is performed to remove the excessive isolation layer 120 and dielectric fin layers 130 and 142 until the semiconductor fins 110a and 110b are exposed and the remained dielectric fin layer 142a covers the oxide layer 140 underneath.

Figure 7A:
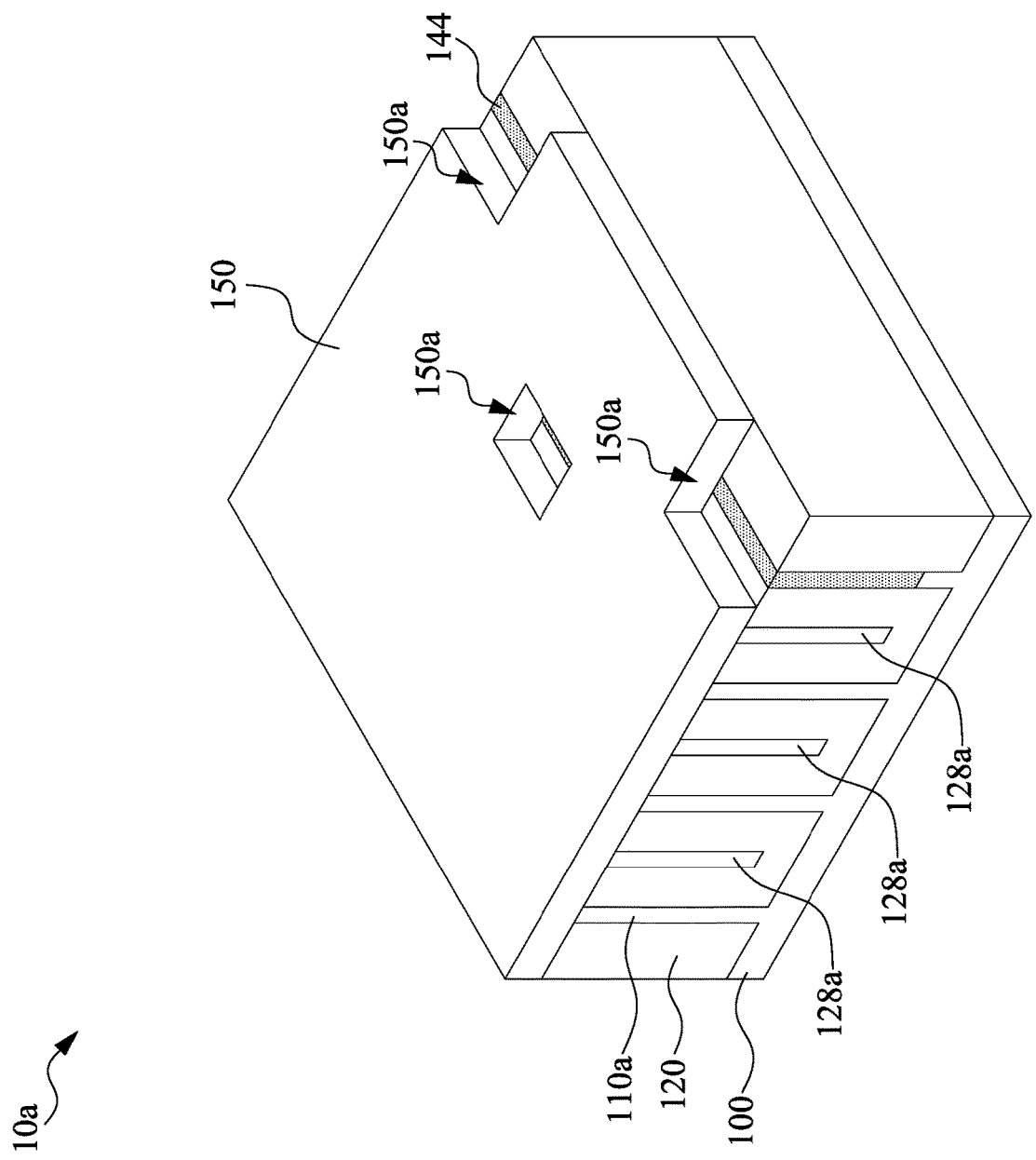
Figure 7B:
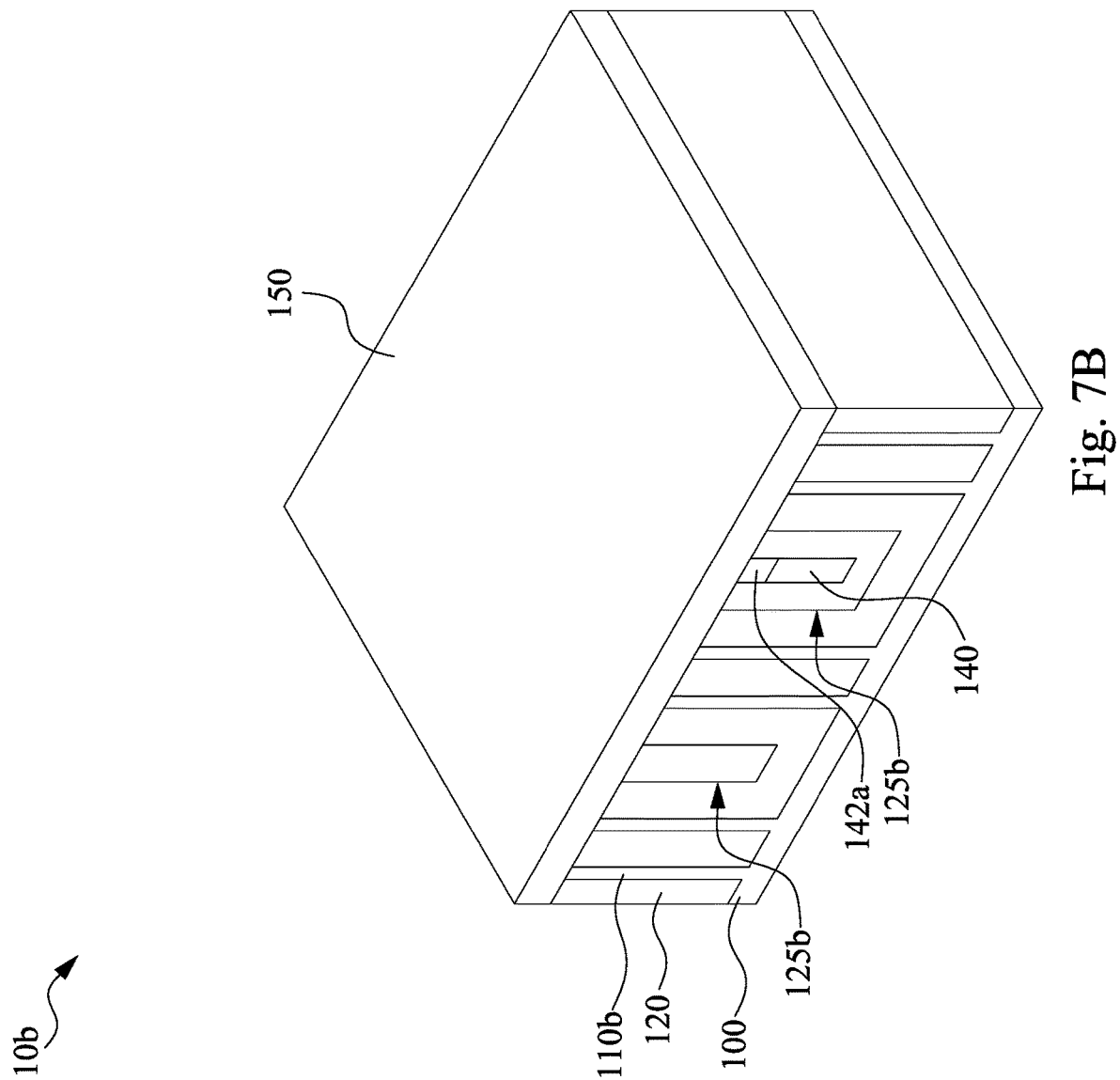

Reference is made to FIGS. 7A to 7B. A mask layer 150 is formed over the substrate and patterned to form plural openings 150a in the memory region 10a. One or more etching process(es) are performed to remove the semiconductor fins 110a through the openings 150a and replaced by dielectric fin layers 144. In some embodiments, the dielectric fin layer 144 may include metal oxides, such as $HfO_2$, $ZrO_2$, $HfAlO_x$, $HfSiO_x$ and the like and may be formed by methods utilized to form such a layer, such as CVD, plasma enhanced CVD, sputter, and other methods known in the art. In some embodiments, the dielectric fin layer 144 may be made from other high-k materials other than metal dielectric materials. In some embodiments, the dielectric fin layer 144 may be made from the same materials as the dielectric fin layers 128 and 142, e.g., the same metal oxides.

Figure 8A:
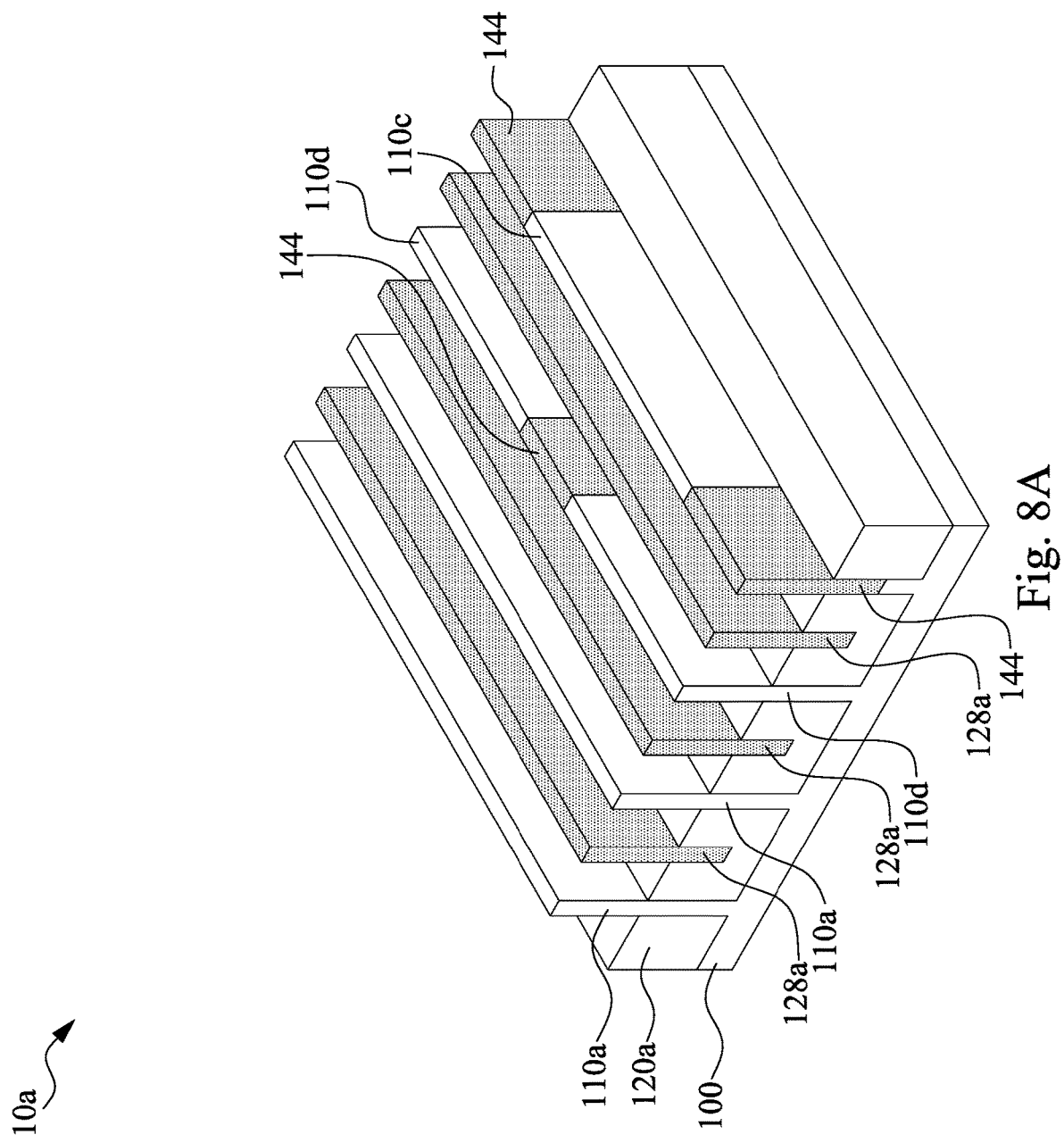

Reference is made to FIGS. 8A to 8B. One or more etching process(es) are performed to form shallow trench isolation (STI) recesses such that semiconductor fins (110a-110d), dielectric fins or dummy fins (128a, 130a, 127, 144) are exposed, and the remained isolation layer 120 forms the isolation structure 120a, and the remained dielectric fin layer 130 forms the dielectric fin 130a and the dielectric fin layer 130b. The semiconductor fin 110c protrudes from the substrate 100 and is sandwiched by a pair of dielectric fins 144 to form a hybrid fin. A pair of semiconductor fin 110d protrudes from the substrate 100 and sandwiches the dielectric fin 144 to form a hybrid fin. In some embodiments, the dielectric fins 128a may be made from high-k dielectric materials while the dielectric fin 130a may be made from high-k dielectric materials. In some embodiments, the dummy fin structure 127 includes the dielectric fin layer 130b as shield and the dielectric fin layer 142a as helmet to collectively wrap around the core oxide layer 140.

In some embodiments, the dielectric fins 128a have a dielectric constant that is higher than a dielectric constant of the dielectric fins 130a. In some embodiments, the dielectric fins 130a and the dielectric fin layer 130b are at least partially embedded in the isolation structure 120a. In some embodiments, the dielectric fin layer 142a may have a higher dielectric constant than that of the dielectric fin layer 130b or the core oxide layer 140.

In some embodiments, the etching process may include dry etching process, wet etching process, and/or combination thereof. The recessing process may also include a selective wet etch or a selective dry etch. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include NH4OH, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 9A:
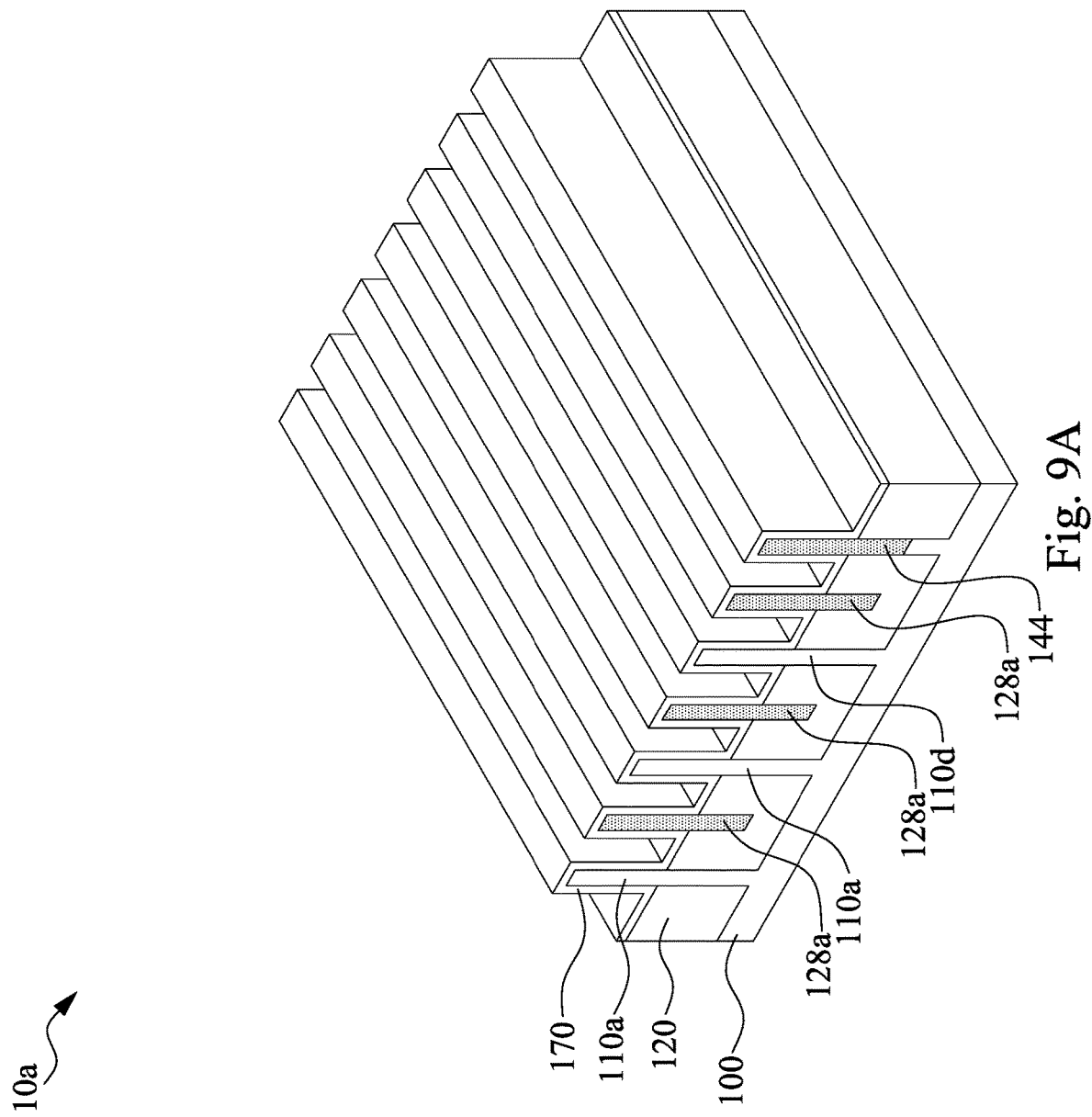

Reference is made to FIGS. 9A to 9B. A dielectric layer 170 is formed over the substrate 100 and conformally covers the structure of FIGS. 8A and 8B, i.e., the semiconductor fins (110a-110d) and dielectric fins or dummy fins (128a, 130a, 127, 144) and the isolation structure 120a. The dielectric layer 170 may act as gate dielectric in later process. The dielectric layer 170 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof.

Figure 10A:
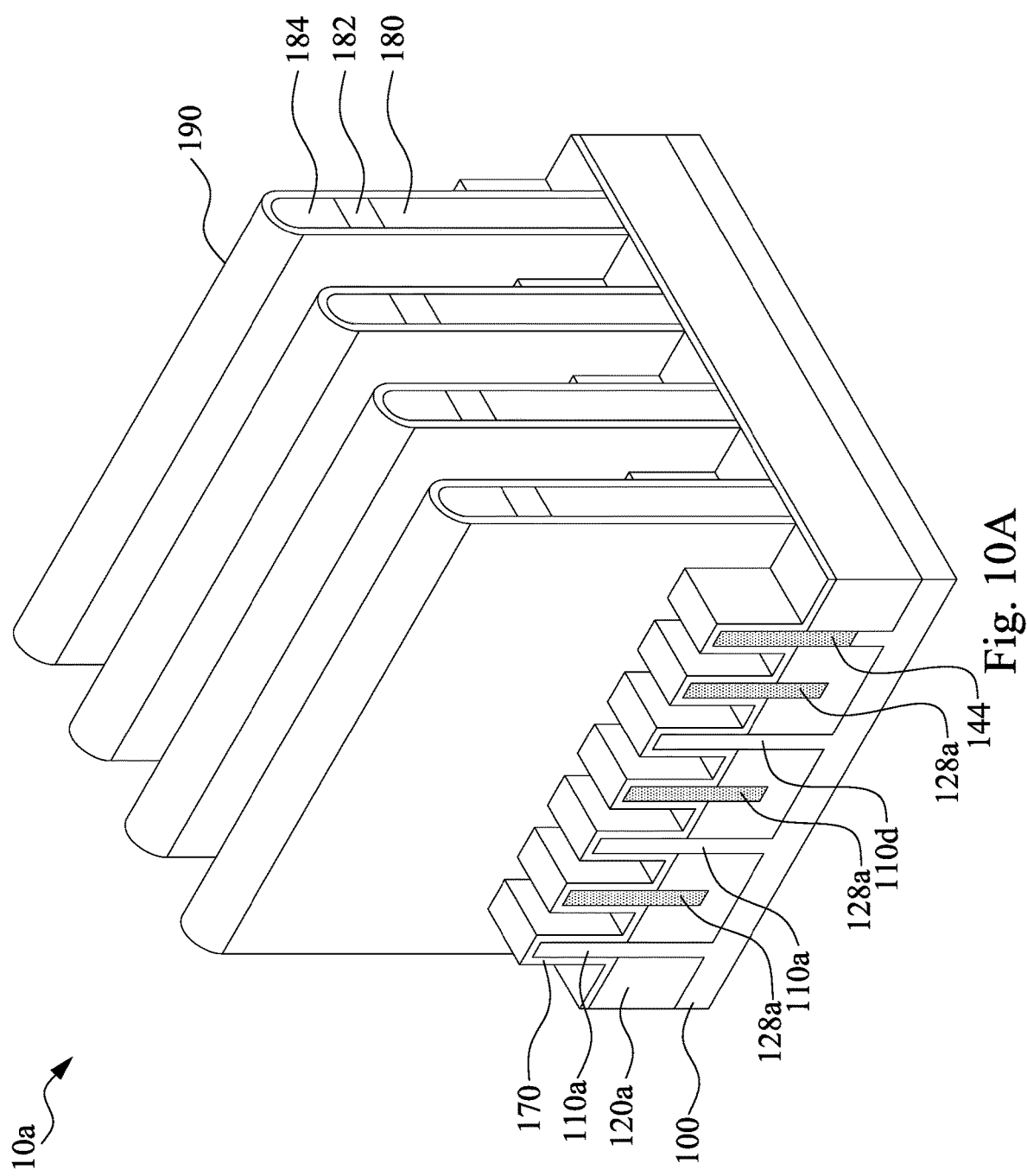
Figure 10B:
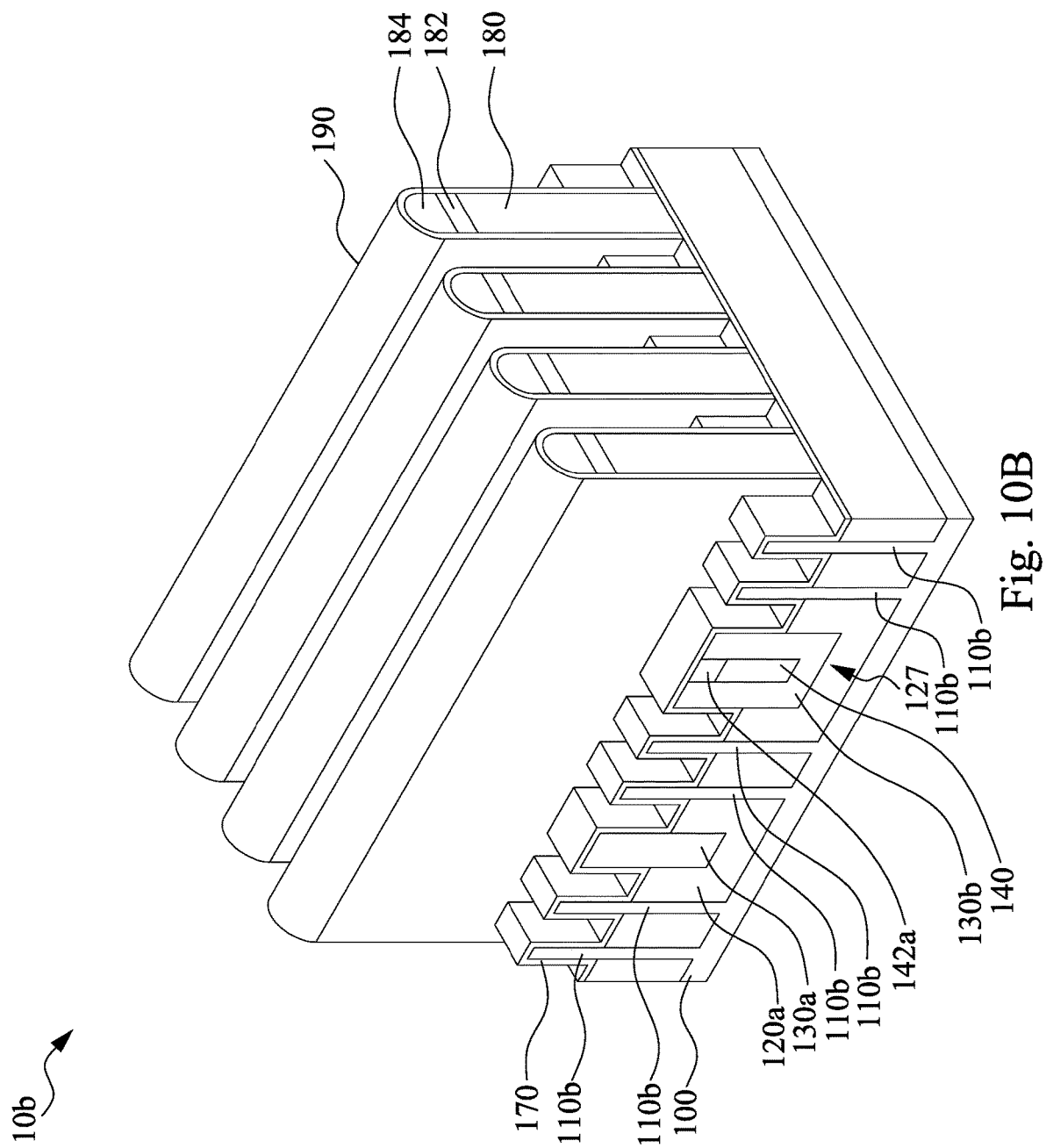

Reference is made to FIGS. 10A to 10B. Plural dummy gates 180 are formed over the dielectric layer 170, in which the dummy gates 180 cross the semiconductor fins (110a-110d) and the dielectric fins (128a, 130a, 127, 144). In some embodiments, mask layers 182 and 184 are formed over the dummy gates 180. The mask layers 182 and 184 acts as a hard mask during the patterning process of the dummy gates 180 and may act as a hard mask during the following processes, such as etching. In some embodiments, the mask layers 182 and 184 may include silicon oxide, silicon nitride and/or silicon oxynitride.

Figure 11A:
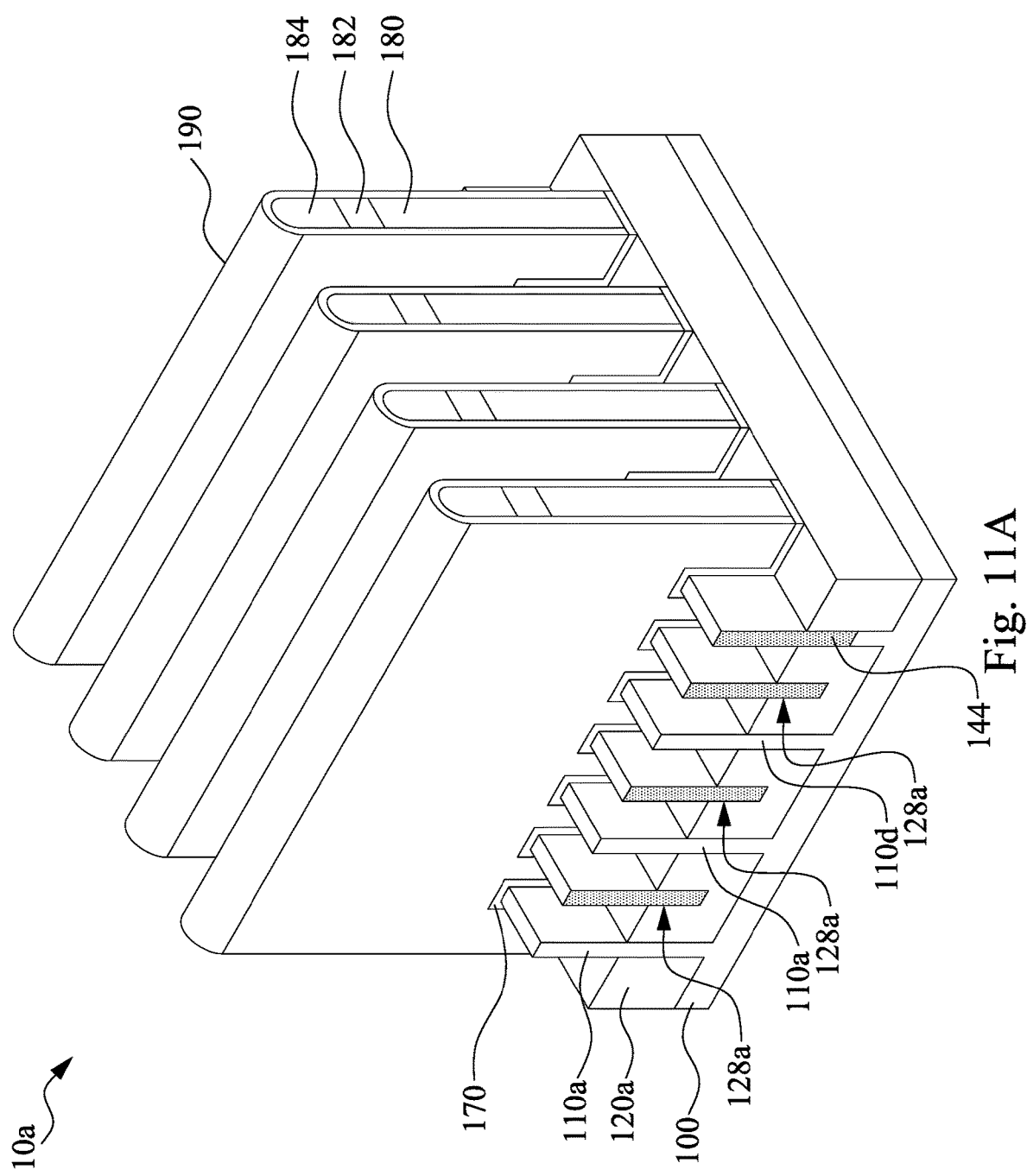
Figure 11B:
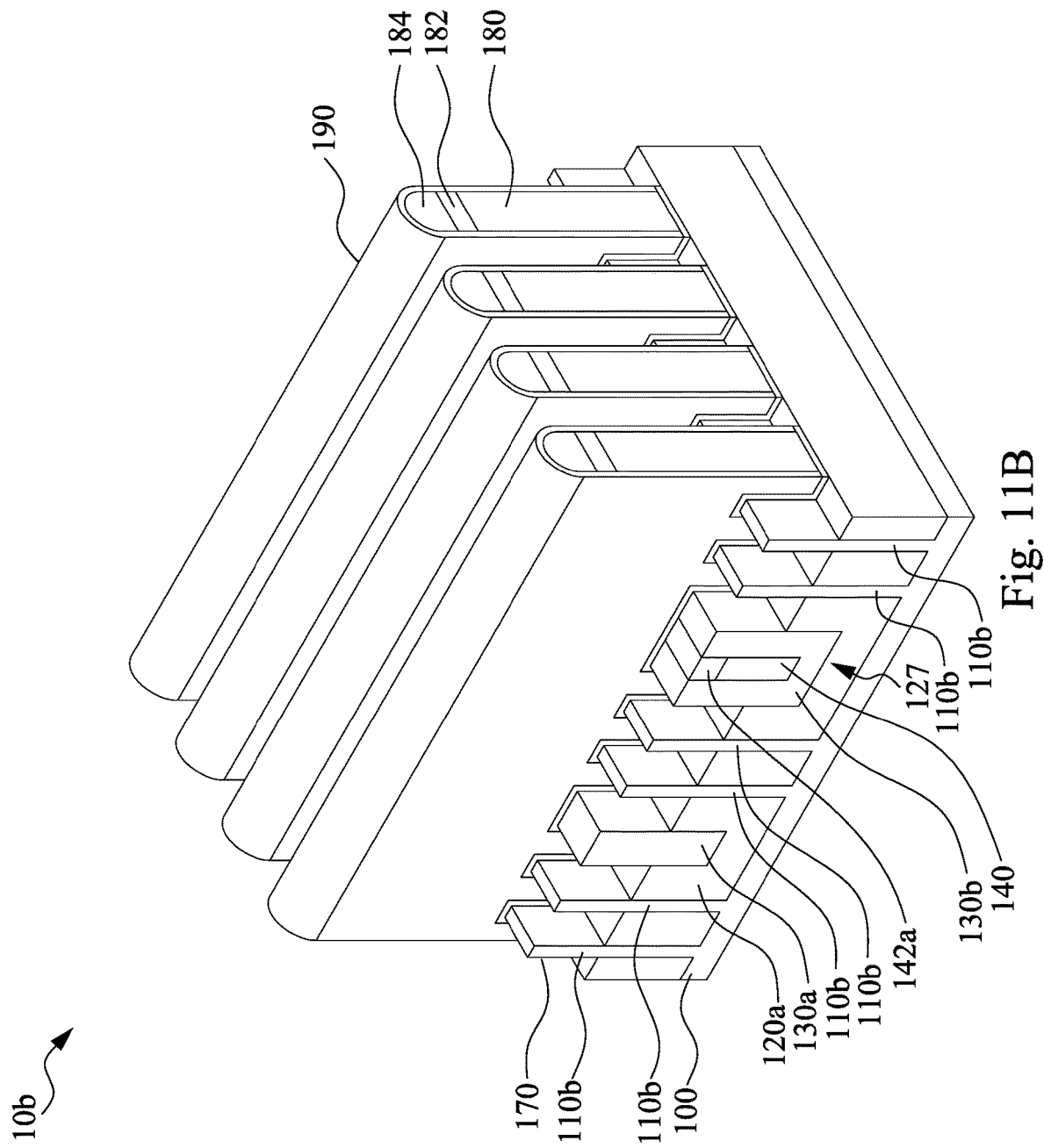
Figure 12A:
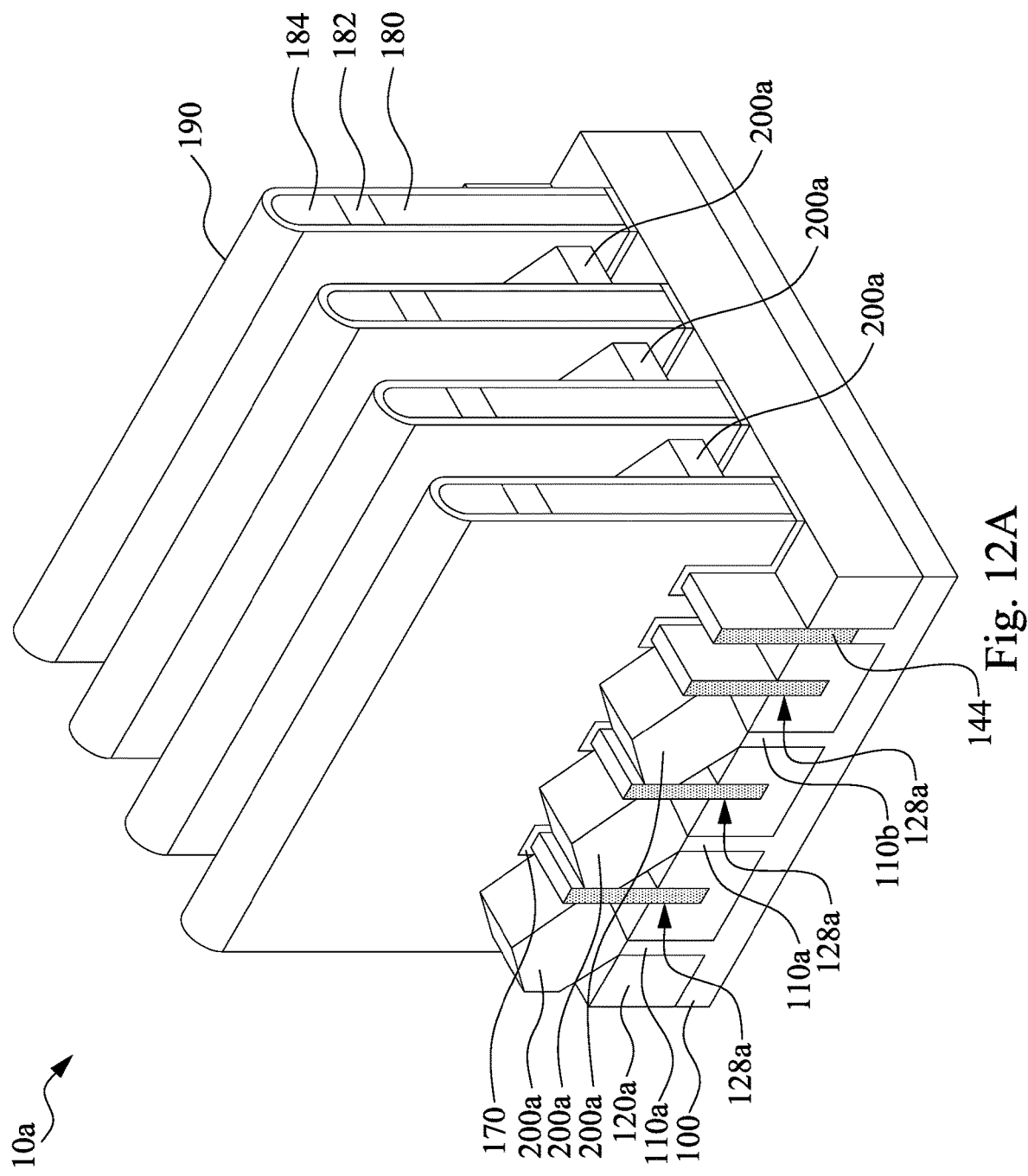
Figure 12B:
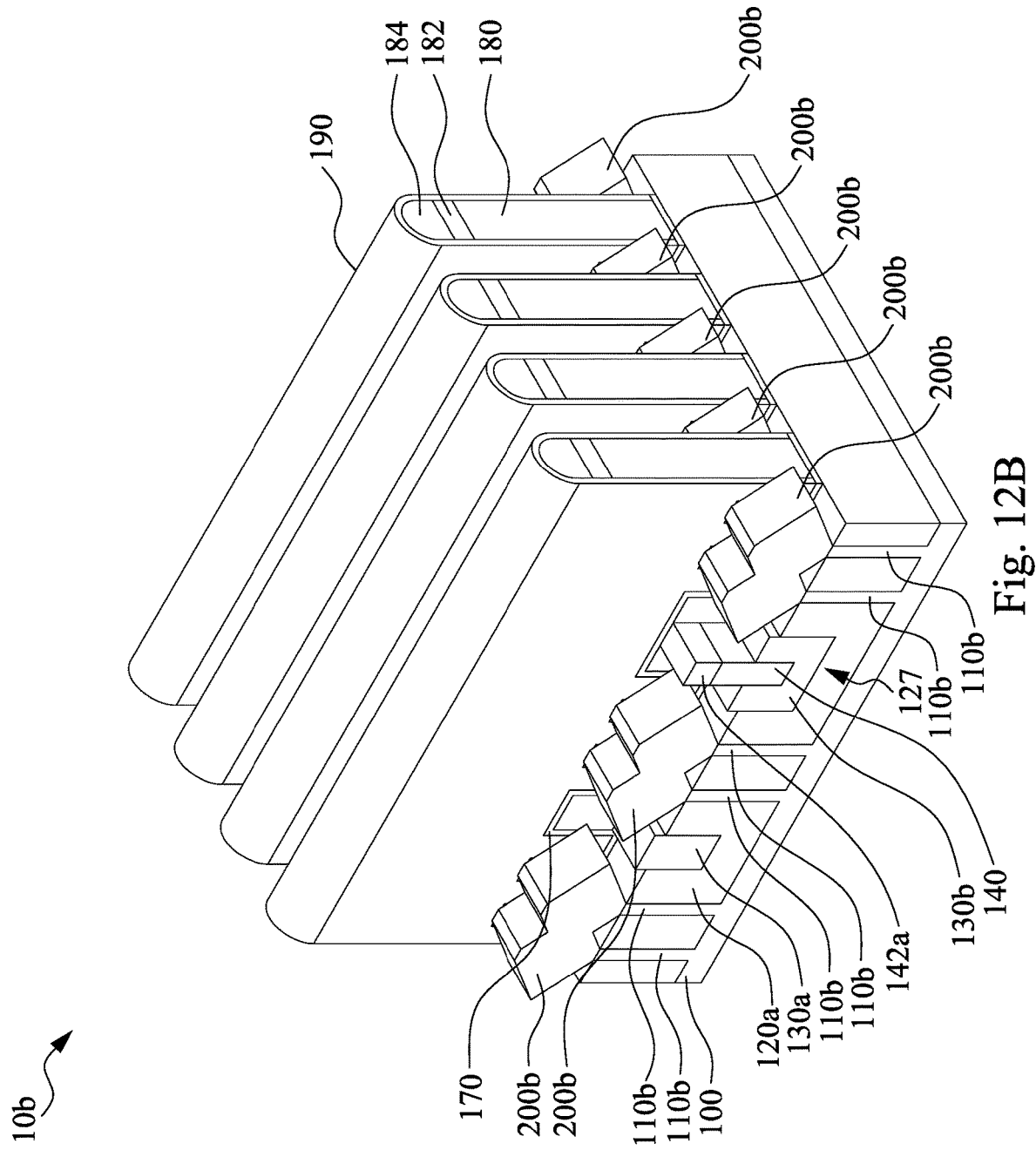
Figure 12C:
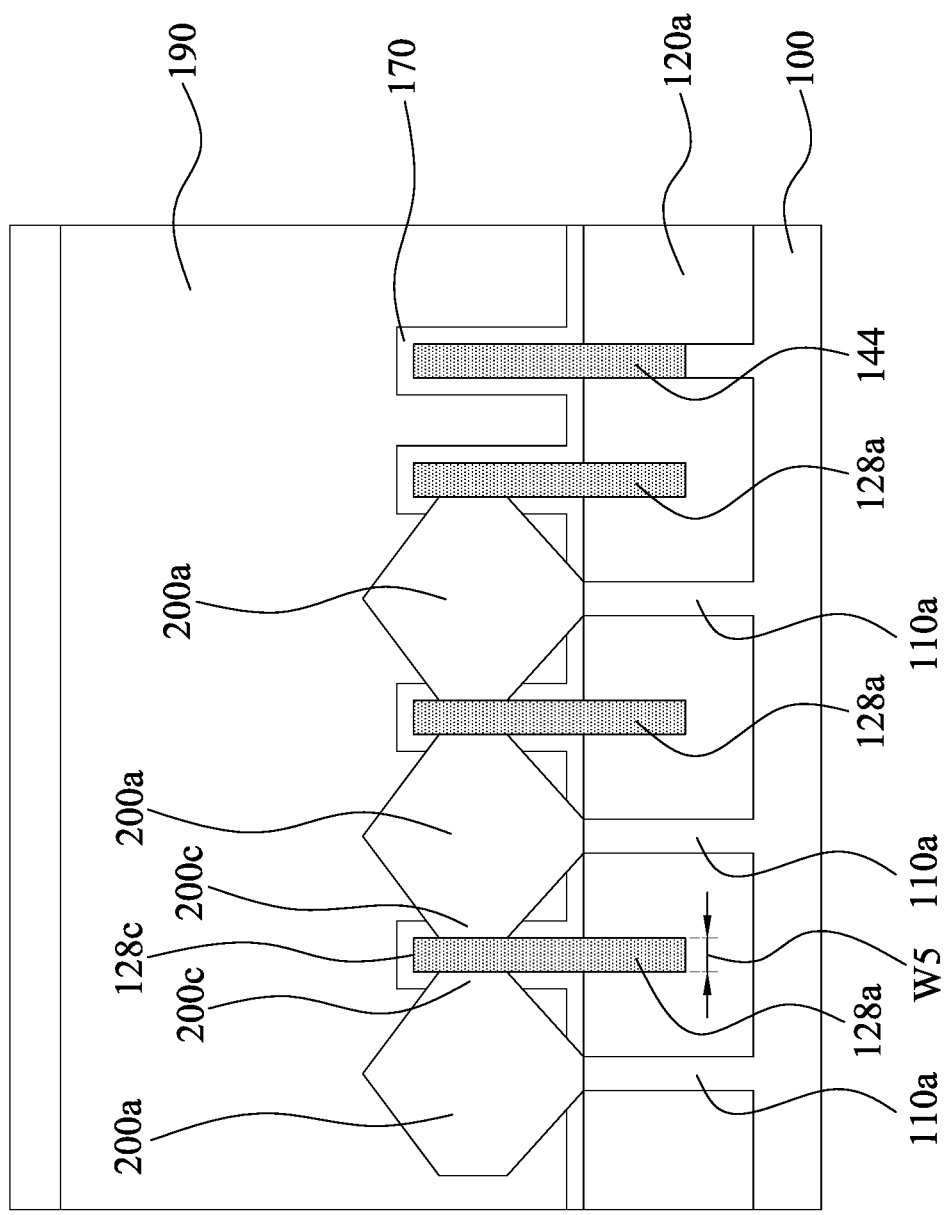
FIG. 12C is a side view of FIG. 12A.
Figure 12D:
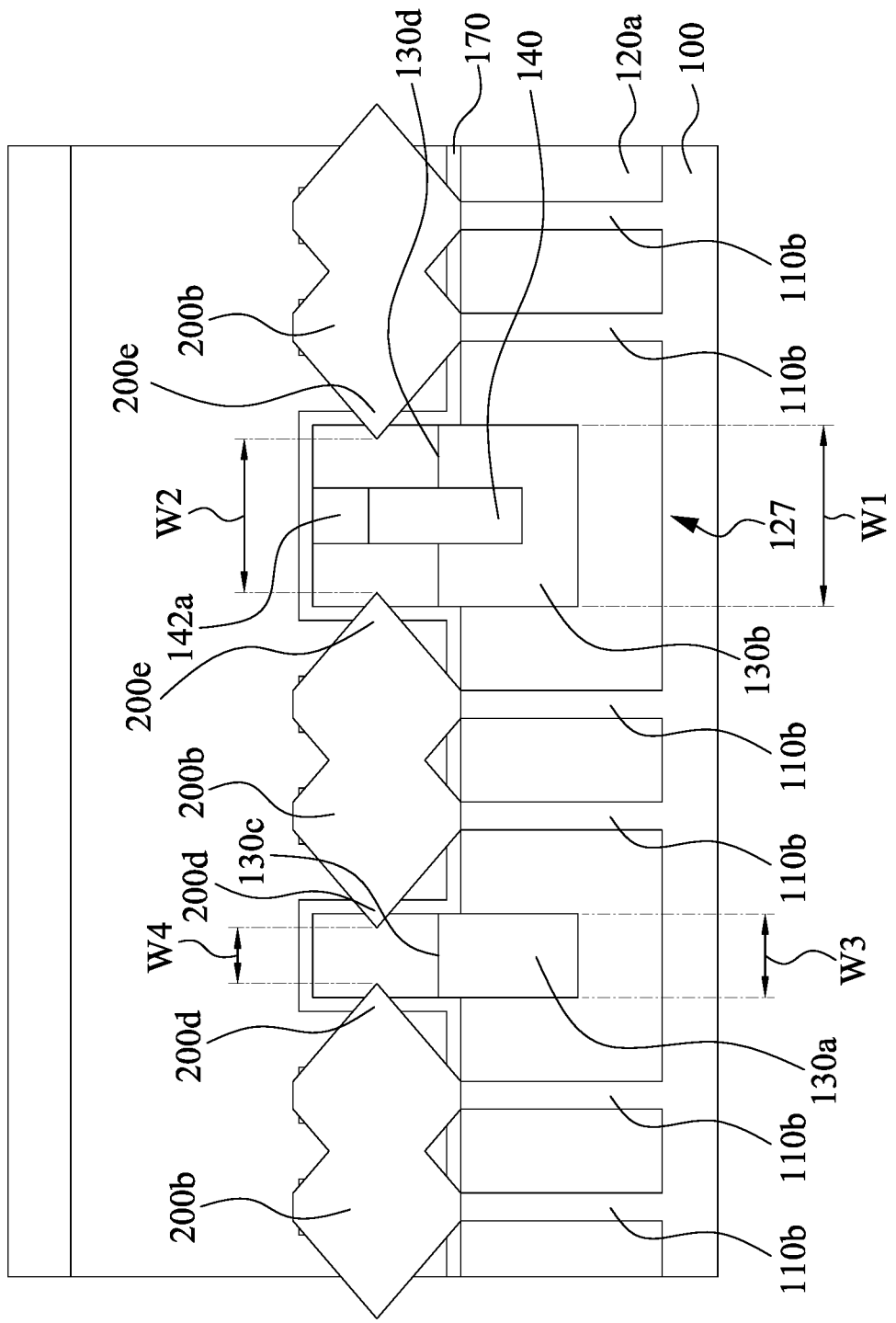
FIG. 12D is a side view of FIG. 12B.

Reference is made to FIGS. 11A to 11B. In some embodiments, the dummy gates 180 may include polycrystalline-silicon (poly-Si) or poly-crystalline silicon-germanium (poly-SiGe). Further, the dummy gates may be doped polysilicon with uniform or non-uniform doping. In some embodiments, the dummy gates 180 may be formed by, for example, forming a dummy gate material layer over the dielectric layer 170. Patterned masks, such as mask layers 182 and 184, are formed over the stack of gate dielectric layer and dummy gate material layer. Then, the dummy gate material layer may be patterned using one or more etching processes, such as one or more dry plasma etching processes or one or more wet etching processes. During the etching process, the patterned mask may act as an etching mask. At least one parameter, such as etchant, etching temperature, etching solution concentration, etching pressure, source power, radio frequency (RF) bias voltage, etchant flow rate, of the patterning (or etching) recipe can be tuned. For example, dry etching process, such as plasma etching, may be used to etch the dummy gate material layer and the gate dielectric until the semiconductor fins (110a-110d) and the dielectric fins (128a, 130a, 127, 144) are exposed.

Gate spacer structures including plural gate spacers 190 on opposite sidewalls of the dummy gates 180 are formed. In some embodiments, at least one of the gate spacers 190 includes single or multiple layers. The gate spacers 190 can be formed by blanket depositing one or more dielectric layer(s) (not shown) on the previously formed structure. The dielectric layer(s) may include silicon nitride (SiN), oxynitride, silicon carbon (SiC), silicon oxynitride (SiON), oxide, and the like. The gate spacers 190 may be formed by methods such as CVD, plasma enhanced CVD, sputter, or the like. The gate spacers 190 may then be patterned, such as by one or more etch processes to remove horizontal portions of the gate spacers 190 from the horizontal surfaces of the structure.

The dielectric layer 170 exposed from the dummy gates 180 and the gate spacers 190 are removed by suitable process, such as etching. The remained portions of the dielectric layer 170 are disposed under the dummy gates 180 and the gate spacers 190. Thus, the remained portions of the dielectric layer 170 may be referred to as gate dielectrics 170.

Reference is made to FIGS. 12A to 12D. Portions of the semiconductor fins (110a-110d) and the dielectric fins (128a, 130a, 127, 144) are exposed after the dielectric layer 170 are partially removed. Then, plural source/drain features (200a, 200b) are respectively formed over the semiconductor fins (110a-110d) of the substrate 100. In some embodiments, the source/drain features 200a are in contact with the dielectric fins 128a, such that the formation of the source/drain features 200a are easily to be controlled.

In some embodiments, a top surface 128c of the dielectric fin 128a may be higher than a portion 200c of the source/drain features 200a that is contact with the dielectric fin 128a such that the greater height of the dielectric fin 128a serves as an isolation wall to avoid source/drain epitaxy bridging in the dense memory region 10a. In some embodiments, each source/drain feature 200a lands on a top of the single one of the semiconductor fins (110a-100c). In some embodiments, each source/drain feature 200b may land on tops of immediately-adjacent two of the semiconductor fins 110b.

In some embodiments, the dielectric fin 130a is further etched to be lower than the source/drain features 200b sandwiching the dielectric fin 130a. In some embodiments, a top surface 130c of the dielectric fin 130a is lower than a portion 200d of each source/drain feature 200b that is closest to the other of a pair of source/drain features 200b sandwiching the dielectric fin 130a such that the pair of source/drain features 200b may grow wider, e.g., beyond the top surface 130c of the dielectric fin 130a. In some embodiments, a width (W3) of the dielectric fin 130a is smaller than a width (W4) between immediately-adjacent or closest portions 200d of the pair of source/drain features 200b sandwiching the dielectric fin 130a.

In some embodiments, the dielectric fin layer 130b is further etched to be lower than the source/drain features 200b sandwiching the dummy fin structure 127 such that the dielectric fin layer 142a (on top of the oxide layer 140) is spaced from the etched dielectric fin layer 130b. In some embodiments, a top surface 130d of the dielectric layer 130b may be lower than a portion 200e of each source/drain feature 200b that is closest to the other of the pair of source/drain features 200b sandwiching the dummy fin structure 127 such that the pair of source/drain features 200b may grow wider, e.g., beyond the top surface 130d of the dielectric layer 130b. In some embodiments, a total width (W1) of the dielectric layer 130b or the dummy fin structure 127 is greater than a width (W2) between immediately-adjacent or closest portions 200e of the pair of source/drain features 200b sandwiching the dummy fin structure 127. In some embodiments, a top surface of the dielectric fin layer 142a may be higher than a portion 200e of each source/drain feature 200b that is closest to the other of the pair of source/drain features 200b sandwiching the dummy fin structure 127 such that the dielectric fin layer 142a serves as an isolation wall to avoid source/drain epitaxy bridging between adjacent source/drain features 200b in the logic region 10b. In some embodiments, a top surface of the oxide layer 140 may be higher than the dielectric layer 130b surrounding around a lower portion of the oxide layer 140. In some embodiments, a top surface of the oxide layer 140 may be higher than the portion 200e of each source/drain feature 200b that is closest to the other of the pair of source/drain features 200b sandwiching the dummy fin structure 127.

In some embodiments, the source/drain features (200a, 200b) may be epitaxy structures, and may also be referred to as epitaxy features (200a, 200b). The source/drain features (200a, 200b) may be formed using one or more epitaxy or epitaxial (epi) processes, such that Si features, SiGe features, and/or other suitable features can be formed in a crystalline state on the semiconductor fins (110a-110d). In some embodiments, the source/drain features (200a, 200b) may be cladding over the semiconductor fins (110a-110d).

In some embodiments, lattice constants of the source/drain features (200a, 200b) are different from lattice constants of the semiconductor fins (110a-110d), such that channels in the semiconductor fins (110a-110d) are strained or stressed to enable carrier mobility of the semiconductor device and enhance the device performance. In some embodiments, the source/drain features (200a, 200b) may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins (110a-110d) (e.g., silicon). The source/drain features (200a, 200b) may be in-situ doped. The doping species include P-type dopants, such as boron or $BF_2$; N-type dopants, such as phosphorus or arsenic; and/or other suitable dopants including combinations thereof. If the source/drain features (200a, 200b) are not in-situ doped, a second implantation process (i.e., a junction implant process) is performed to dope the source/drain features (200a, 200b). One or more annealing processes may be performed to activate the source/drain features (200a, 200b). The annealing processes include rapid thermal annealing (RTA) and/or laser annealing processes.

In some embodiments, the source/drain features (200a, 200b) over the semiconductor fins may include the same doping-type, or different doping-types. For example, some of the source/drain features (200a, 200b) may be n-type and the others of source/drain feature (200a, 200b) may be p-type, and vise versa.

Figure 13A:
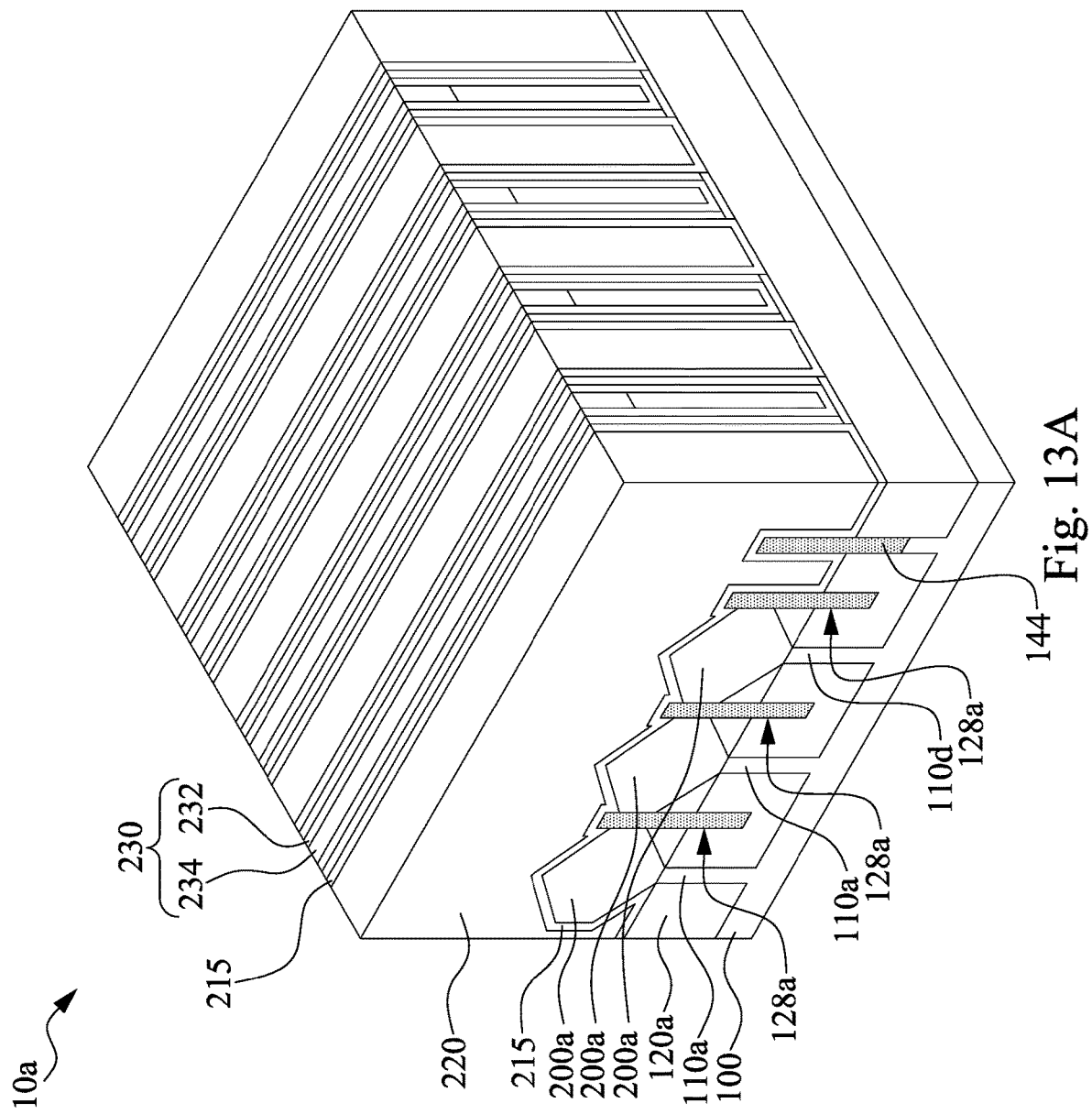
Figure 13B:
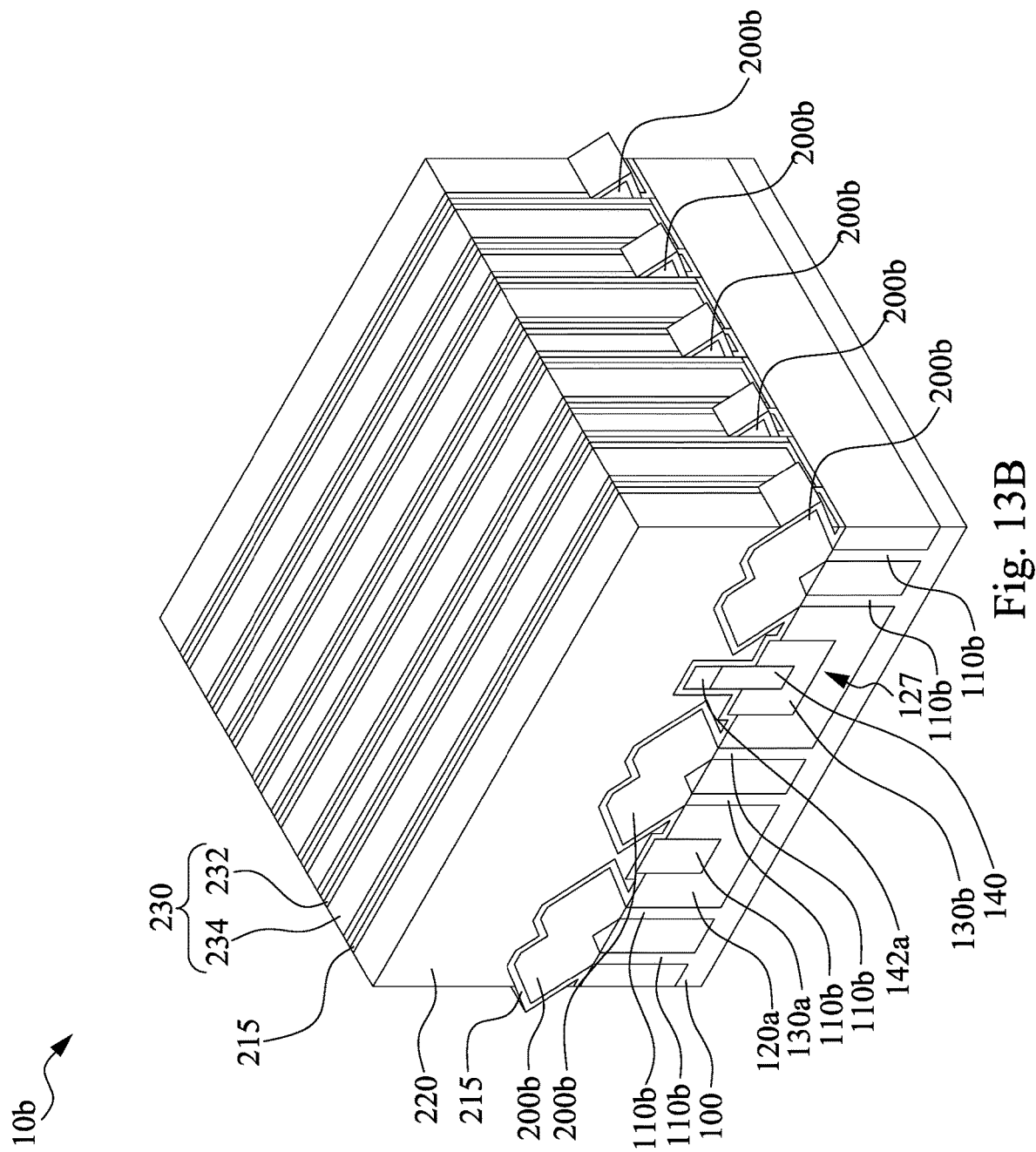
Figure 14A:
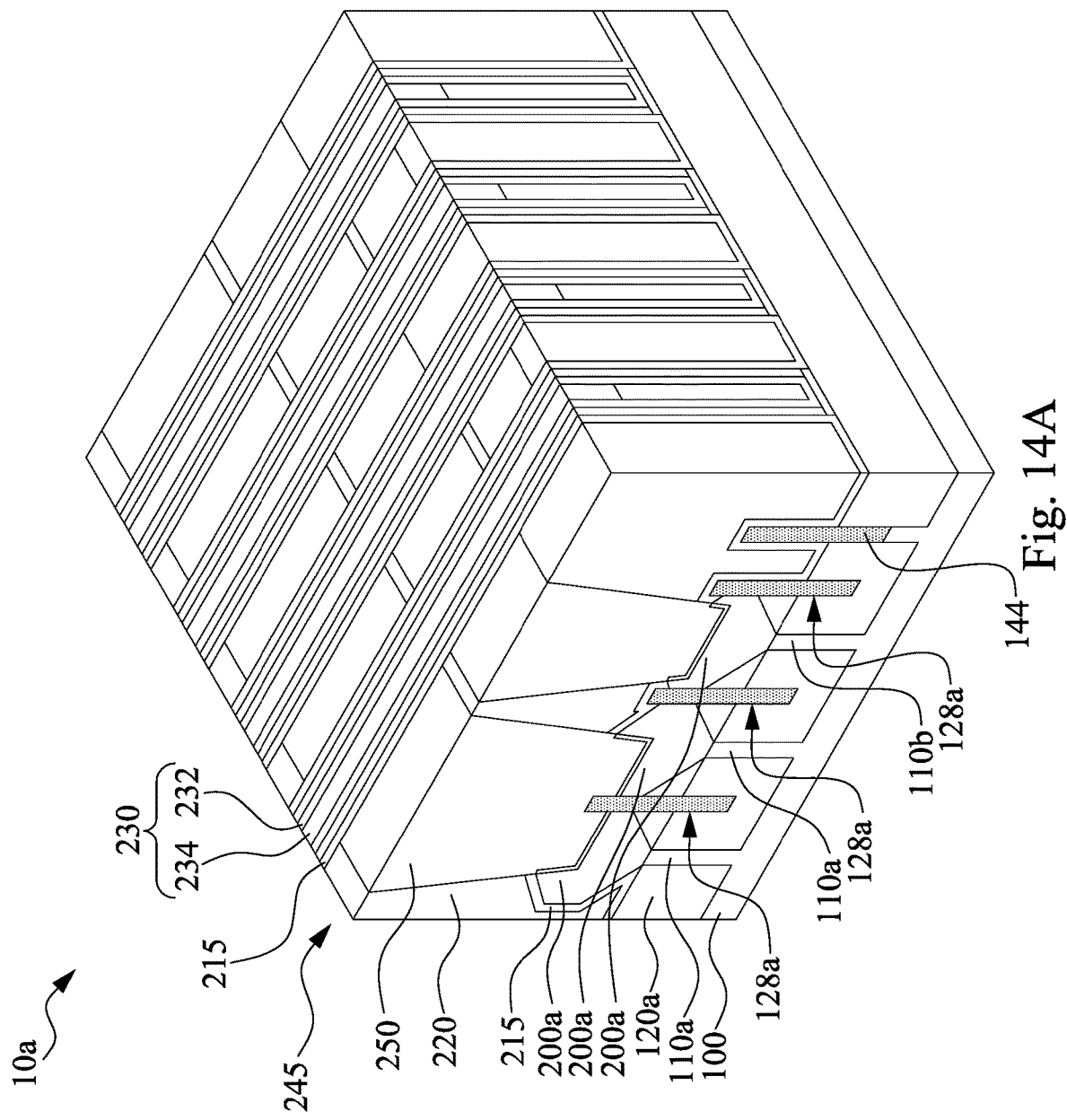
Figure 14B:
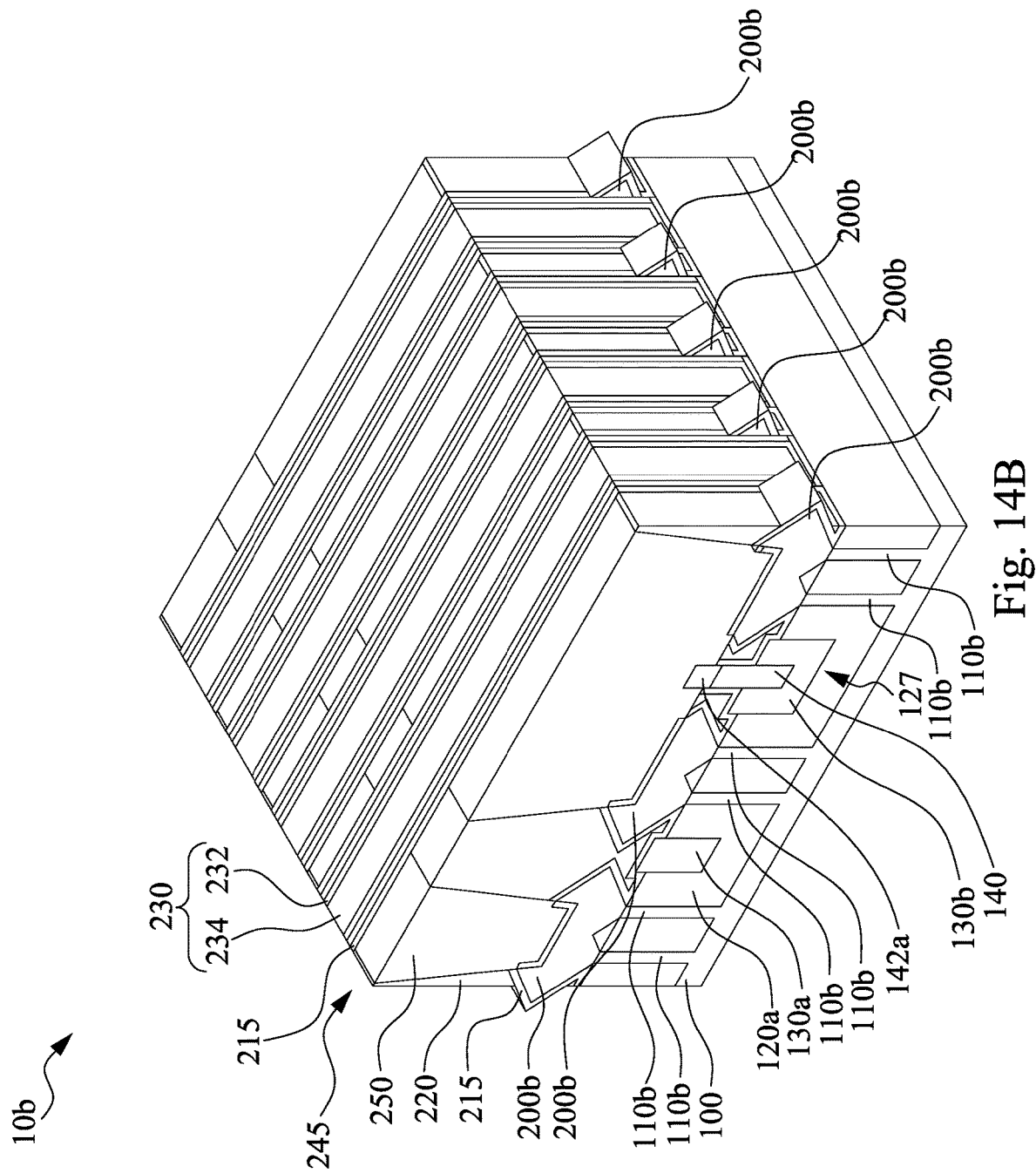
Figure 14C:
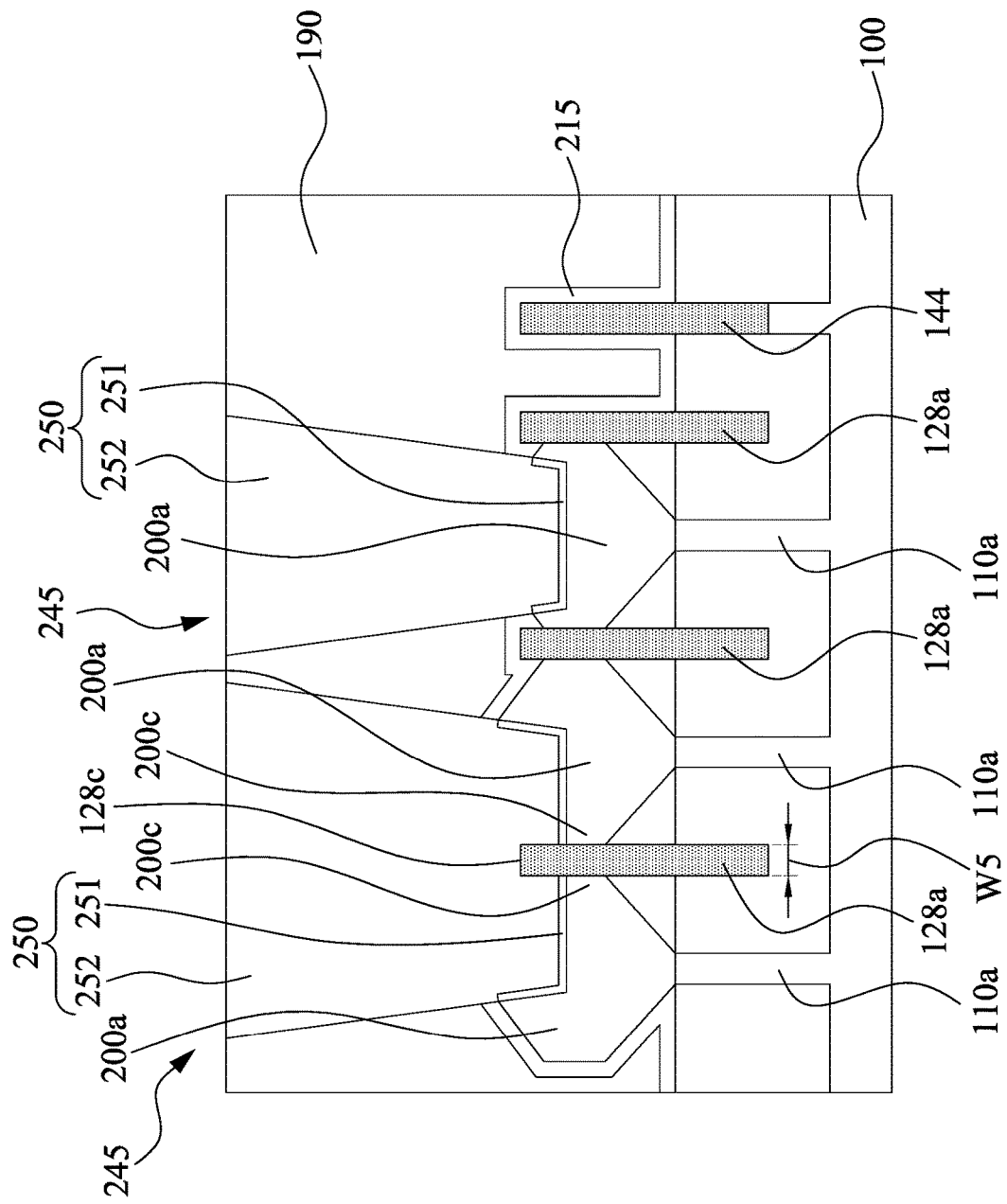
FIG. 14C is a side view of FIG. 14A.
Figure 14D:
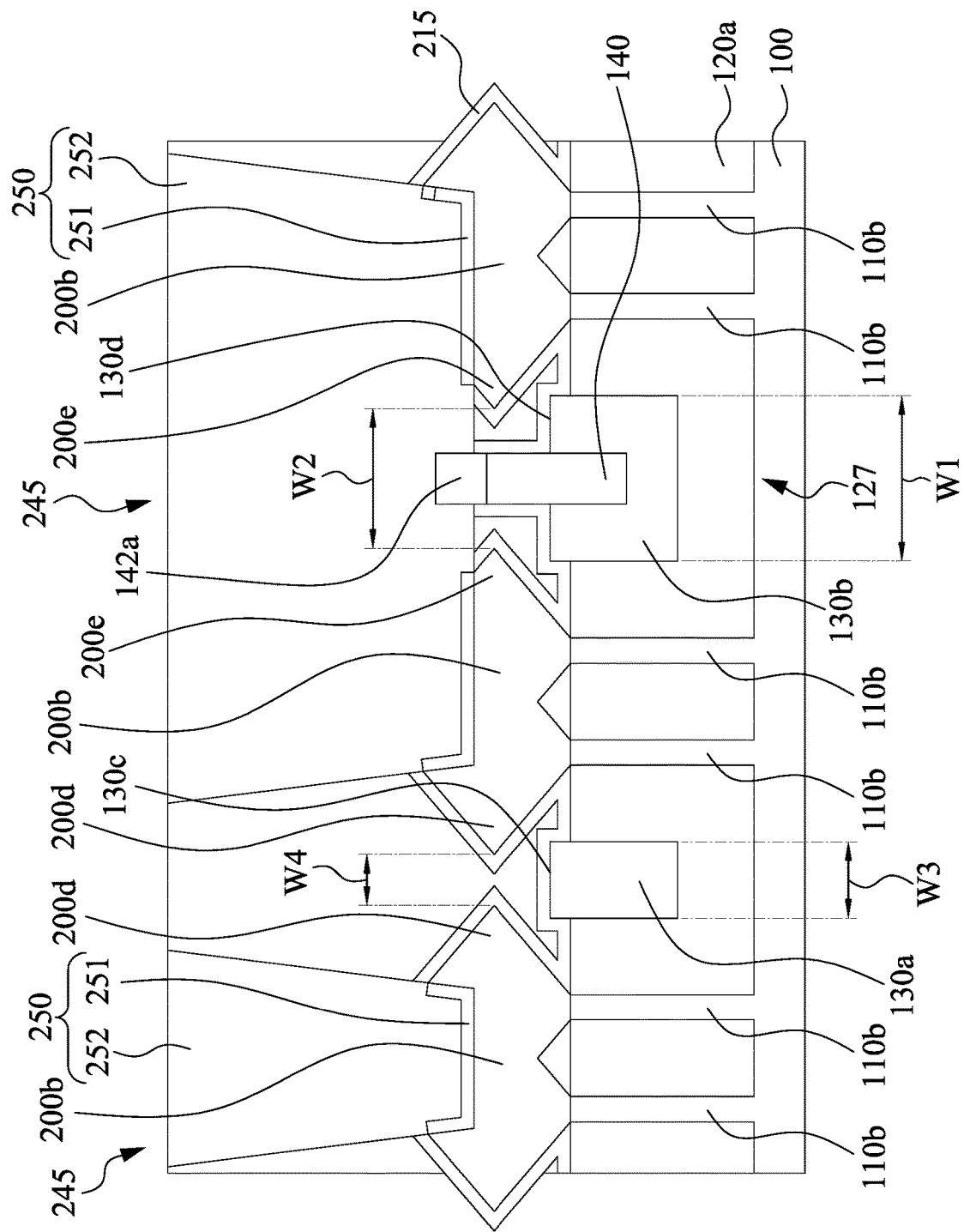
FIG. 14D is a side view of FIG. 14B.

Reference is made to FIGS. 13A to 13B. An etching stop layer 215 is formed over the substrate 100 and covers the source/drain features (200a, 200b), and an interlayer dielectric 220 is formed over the etching stop layer 215. Then, a CMP process is performed to remove the excessive interlayer dielectric 220, and the mask layers 182 and 184 (referring to FIGS. 10A to 10B) until the dummy gates 180 are exposed.

In some embodiments, the interlayer dielectric 220 may include silicon nitride, silicon oxynitride, silicon oxycarbonitride, silicon carbide, silicon germanium, or combinations thereof. The interlayer dielectric 220 may be formed by a suitable technique, such as CVD, ALD and spin-on coating. In some embodiments, air gaps may be created in the interlayer dielectric 220.

Then, a replacement gate (RPG) process scheme is employed. The dummy gates 180 are replaced with gate stacks 230. For example, the dummy gates are removed to from a plurality of gate trenches. The dummy gates are removed by a selective etch process, including a selective wet etch or a selective dry etch, and carries a substantially vertical profile of the gate spacers 190. The gate trenches expose portions of the semiconductor fins (110a-110d) of the substrate 100. Then, the gate stacks 230 are formed respectively in the gate trenches and cover the semiconductor fins (110a-110d) of the substrate 100.

The gate stacks 230 include an interfacial layer (not shown), gate dielectrics 232 formed over the interfacial layer, and gate metals 234 formed over the gate dielectrics 232. The gate dielectrics 232, as used and described herein, include dielectric materials having a high dielectric constant, for example, greater than that of thermal silicon oxide (~3.9). The gate metals 234 may include a metal, metal alloy, and/or metal silicide.

In some embodiments, the gate metals 234 included in the gate stacks 230 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide. For example, the gate metals 234 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electro-plating and/or other suitable process.

In some embodiments, the interfacial layer may include a dielectric material such as silicon oxide ($SiO_2$), HfSiO, and/or silicon oxynitride (SiON). The interfacial layer may be formed by chemical oxidation, thermal oxidation, ALD, CVD, and/or other suitable method. The gate dielectrics 232 may include a high-K dielectric layer such as hafnium oxide ($HfO_2$). Alternatively, the gate dielectric 212 may include other high-K dielectrics, such as $TiO_2$, $HfZrO$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectrics 232 may be formed by ALD, PVD, CVD, oxidation, and/or other suitable methods.

Reference is made to FIGS. 14A to 14D. An etching process is performed to remove portions of the interlayer dielectric 220 and the etching stop layer 215. Thus, plural openings 245 are formed in the interlayer dielectric 220 and the etching stop layer 215 to expose the source/drain features (200a, 200b) and the dielectric fin 128a and the dummy fin structure 127.

Then, plural contacts 250 are formed in the openings 245. The contacts 250 may be formed by depositing a conductive material layer over the substrate 100 and following with a CMP process until the gate stacks 230 are exposed. In some embodiments, the contacts 250 are in contact with the source/drain features 200a and/or the dielectric fins 128a. For example, in FIG. 14A, one of the contacts 250 is in contact with a pair of source/drain features 200a landing on a pair of semiconductor fins 110a, and is in contact with the dielectric fin 128a between the pair of semiconductor fins 110a. The dielectric fin 128a can support the contact 250, such that the contact 250 does not extend further into a space between the pair of source/drain features 200a. In some embodiments, at least one of the contacts 250 includes a barrier layer 251 and conductive layer 252. In some embodiments, the conductive layer 252 may include suitable metal, such as TiN, WN, TaN, or Ru, which performs in a p-type FinFET. In some alternative embodiments, the metal layer may include suitable metal, such as Ti, Ag, Al, TiAl, TiAlN, TiAlC, TiAlCN, TaC, TaCN, TaSiN, Mn, or Zr, which performs in an n-type FinFET. In some other embodiments, the contacts 250 may be multi-layer including, work function layers, liner layers, interface layers, seed layers, adhesion layers, barrier layers and so on.

In some embodiments, the dielectric fin layer 142a of the dummy fin structure 127 may be embedded in the conductive layer 252 of the contact 250. In some embodiments, a top of one of the dielectric fins 128 may be embedded in the conductive layer 252 of the contact 250. In some embodiments, the dielectric fin layer 142a has a width (d) greater than about 20 nm. In some embodiments, the dielectric fin layer 142a has a height (h) ranging from about 5 nm to about 50 nm. In some embodiments, the dielectric fin 128a may have a width (W5) that is smaller than a width (W3) of the dielectric fin 130a. In some embodiments, the width (W5) of the dielectric fin 128a may range from about 5 nm to about 10 nm. In some embodiments, the width (W3) of the dielectric fin 130a may be greater than about 10 nm.

According to aforementioned embodiments, a semiconductor device has a high-k dummy fin in a memory-device (e.g., SRAM) area and has a low-k dummy fin in a logic-device area. The high-k dummy fin has a greater height but a narrower width while the low-k dummy fin has a lower height but a larger width. In the wide area of the logic-device area, a dummy fin structure includes a low-k dummy fin layer as shield, a high-k dummy fin layer as helmet and a FCVD oxide layer embedded inside the low-k dummy fin layer. With such configuration, the greater height of the high-k dummy fin serves as an isolation wall to avoid source/drain epitaxy bridging in the dense memory-device area, and the lower height of the low-k dummy fin benefits the wider epitaxy structure since no dummy fin blocks epitaxy growth, and the low-k dummy fin in a logic-device area benefits for high speed and avoid power loss.

An embodiment of the present disclosure is a semiconductor device having a substrate, a first dielectric fin, and a second dielectric fin. The substrate has plural semiconductor fins. The first dielectric fin is disposed over the substrate and between the semiconductor fins. The second dielectric fin is disposed over the substrate and between the semiconductor fins. The first dielectric fin has a first dielectric constant that is higher than a second dielectric constant of the second dielectric fin.

An embodiment of the present disclosure is that the first dielectric fin has a first width that is smaller than a second width of the second dielectric fin.

An embodiment of the present disclosure is the semiconductor device further including a pair of first epitaxy structures disposed on two of the semiconductor fins and in contact with the first dielectric fin.

An embodiment of the present disclosure is that a top surface of the first dielectric fin is higher than a portion of each first epitaxy structure that is contact with the first dielectric fin.

An embodiment of the present disclosure is the semiconductor device further including a pair of second epitaxy structures sandwiching the second dielectric fin.

An embodiment of the present disclosure is that each second epitaxy structure lands on immediately-adjacent two of the semiconductor fins.

An embodiment of the present disclosure is that a top surface of the second dielectric fin is lower than a portion of each second epitaxy structure that is closest to the other of the pair of second epitaxy structures.

An embodiment of the present disclosure is that the first dielectric fin is made from metal oxide dielectric materials.

An embodiment of the present disclosure is that the second dielectric fin is made from nitride dielectric materials.

An embodiment of the present disclosure is a semiconductor device having a substrate, an isolation structure and a dummy fin structure. The substrate has plural semiconductor fins. The isolation structure is located over the substrate. The dummy fin structure is spaced from the semiconductor fins and includes first, second, third dielectric fin layers. The first dielectric fin layer is at least partially embedded in the isolation structure. The second dielectric fin layer is at least partially embedded in the first dielectric fin layer and has a different material from that of the first dielectric fin layer. The third dielectric fin layer is located on a top of the second dielectric fin layer and has a higher dielectric constant than that of the first dielectric fin layer.

An embodiment of the present disclosure is that the third dielectric fin layer is spaced from the first dielectric fin layer.

An embodiment of the present disclosure is that the first dielectric fin layer is made from nitride dielectric materials.

An embodiment of the present disclosure is that the second dielectric fin layer is made from a flowable chemical vapor deposition oxide layer.

An embodiment of the present disclosure is that the third dielectric fin layer is made from metal oxide dielectric materials.

An embodiment of the present disclosure is the semiconductor device further including a pair of epitaxy structures sandwiching the dummy fin structure.

An embodiment of the present disclosure is that a top surface of the third dielectric fin layer is higher than a portion of each epitaxy structure that is closest to the other of the pair of epitaxy structures.

An embodiment of the present disclosure is that a top surface of the first dielectric fin layer is lower than a portion of each epitaxy structure that is closest to the other of the pair of epitaxy structures.

An embodiment of the present disclosure is a method for manufacturing a semiconductor device including depositing an isolation layer over a plurality of semiconductor fins, such that the isolation layer defines a first trench between the semiconductor fins; depositing a first dielectric fin layer over the isolation layer, such that the first dielectric fin layer defines a second trench between the semiconductor fins; depositing a second dielectric fin layer over the first dielectric fin layer; recessing the second dielectric fin layer, such that the second dielectric fin layer is recessed from an opening of the second trench; depositing a third dielectric fin layer over the recessed second dielectric fin layer; and removing excess portions of the isolation layer, the first dielectric fin layer, and the third dielectric fin layer over top surfaces of the semiconductor fins; and recessing the isolation layer, such that upper portions of the semiconductor fins protrude from a top surface of the recessed isolation layer.

An embodiment of the present disclosure is the method further including removing a top portion of the first dielectric fin layer such that the third dielectric fin layer is spaced from the etched first dielectric fin layer.

An embodiment of the present disclosure is the method further including performing a flowable chemical vapor deposition to deposit the second dielectric fin layer over the first dielectric fin layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate comprising plural semiconductor fins;
a first dielectric fin disposed over the substrate and between the semiconductor fins; and
a second dielectric fin disposed over the substrate and between the semiconductor fins, wherein the first dielectric fin has a first dielectric constant that is higher than a second dielectric constant of the second dielectric fin.

2. The semiconductor device of claim 1, wherein the first dielectric fin has a first width that is smaller than a second width of the second dielectric fin.

3. The semiconductor device of claim 1, further comprising a pair of first epitaxy structures disposed on two of the semiconductor fins and in contact with the first dielectric fin.

4. The semiconductor device of claim 3, wherein a top surface of the first dielectric fin is higher than a portion of each first epitaxy structure that is contact with the first dielectric fin.

5. The semiconductor device of claim 1, further comprising a pair of second epitaxy structures sandwiching the second dielectric fin.

6. The semiconductor device of claim 5, wherein each second epitaxy structure lands on immediately-adjacent two of the semiconductor fins.

7. The semiconductor device of claim 5, wherein a top surface of the second dielectric fin is lower than a portion of each second epitaxy structure that is closest to the other of the pair of second epitaxy structures.

8. The semiconductor device of claim 1, wherein the first dielectric fin comprises metal oxide dielectric materials.

9. The semiconductor device of claim 1, wherein the second dielectric fin comprises nitride dielectric materials.

10. A semiconductor device, comprising:
a substrate including a semiconductor fin; and
a dummy fin structure spaced from the semiconductor fin and including:
a first dielectric fin layer;
a second dielectric fin layer above the first dielectric fin layer and having a material different from a material of the first dielectric fin layer; and
a third dielectric fin layer above the second dielectric fin layer and having a dielectric constant higher than a dielectric constant of the first dielectric fin layer.

11. The semiconductor device of claim 10, wherein the third dielectric fin layer is spaced from the first dielectric fin layer.

12. The semiconductor device of claim 10, wherein the first dielectric fin layer includes nitride.

13. The semiconductor device of claim 10, wherein the second dielectric fin layer includes flowable chemical vapor deposition oxide layer.

14. The semiconductor device of claim 10, wherein the third dielectric fin layer includes metal oxide.

15. The semiconductor device of claim 10, further comprising a pair of epitaxy structures sandwiching the dummy fin structure.

16. The semiconductor device of claim 15, wherein a top surface of the third dielectric fin layer is higher than a portion of the epitaxy structures.

17. The semiconductor device of claim 15, wherein a top surface of the first dielectric fin layer is lower than a portion of the epitaxy structures.

* * * * *